United States Patent
Khaderbad et al.

(10) Patent No.: US 12,389,674 B2
(45) Date of Patent: *Aug. 12, 2025

(54) LOW RESISTANCE FILL METAL LAYER MATERIAL AS STRESSOR IN METAL GATES

(71) Applicant: Taiwan Semiconductor Manufacturing Co., Ltd., Hsin-Chu (TW)

(72) Inventors: Mrunal A. Khaderbad, Hsinchu (TW); Ziwei Fang, Hsinchu (TW); Keng-Chu Lin, Ping-Tung (TW); Hsueh Wen Tsau, Miaoli County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/594,073

(22) Filed: Mar. 4, 2024

(65) Prior Publication Data
US 2024/0258318 A1  Aug. 1, 2024

Related U.S. Application Data

(63) Continuation of application No. 17/870,964, filed on Jul. 22, 2022, now Pat. No. 11,923,367, which is a
(Continued)

(51) Int. Cl.
*H10D 84/85* (2025.01)
*H10D 84/01* (2025.01)
*H10D 84/03* (2025.01)

(52) U.S. Cl.
CPC ......... *H10D 84/853* (2025.01); *H10D 84/014* (2025.01); *H10D 84/0158* (2025.01);
(Continued)

(58) Field of Classification Search
CPC ......... H01L 27/0924; H01L 21/823431; H01L 21/82345; H01L 21/823821;
(Continued)

(56) References Cited

U.S. PATENT DOCUMENTS 10,734,447 B2 * 8/2020 Ando ................... H10N 70/021
10,879,308 B1 12/2020 Ando et al.
(Continued)

FOREIGN PATENT DOCUMENTS

CN 205355053 U 6/2016

OTHER PUBLICATIONS

Daniel Gall, "Electron mean free path in elemental metals," Journal of Applied Physics 119, Feb. 23, 2016, pp. 085101-1-085101-5, 5 pages, AIP Publishing.

*Primary Examiner* — Christine A Enad
(74) *Attorney, Agent, or Firm* — HAYNES AND BOONE, LLP

(57) ABSTRACT

An integrated circuit (IC) device includes a semiconductor substrate having a first plurality of stacked semiconductor layers in a p-type transistor region and a second plurality of stacked semiconductor layers in a n-type transistor region. A gate dielectric layer wraps around each of the first and second plurality of stacked semiconductor layers. A first metal gate in the p-type transistor region has a work function metal layer and a first fill metal layer, where the work function metal layer wraps around and is in direct contact with the gate dielectric layer and the first fill metal layer is in direct contact with the work function metal layer. A second metal gate in the n-type transistor region has a second fill metal layer that is in direct contact with the gate dielectric layer, where the second fill metal layer has a work function about equal to or lower than 4.3 eV.

20 Claims, 17 Drawing Sheets

Related U.S. Application Data continuation of application No. 16/717,433, filed on Dec. 17, 2019, now Pat. No. 11,404,416.

(52) U.S. Cl.
CPC ..... H10D 84/0177 (2025.01); H10D 84/0193 (2025.01); H10D 84/038 (2025.01)

(58) Field of Classification Search
CPC .......... H01L 21/823842; H10D 84/853; H10D 84/0158; H10D 84/014; H10D 84/0193; H10D 84/038; H10D 84/0177
See application file for complete search history.

(56) References Cited

U.S. PATENT DOCUMENTS

| | | |
|---|---|---|
| 11,404,416 B2 | 8/2022 | Khaderbad et al. |
| 2013/0270512 A1 | 10/2013 | Radosavljevic et al. |
| 2015/0311083 A1* | 10/2015 | Xiao ................ H01L 29/66545 438/595 |
| 2016/0204218 A1 | 7/2016 | Grass et al. |
| 2016/0218215 A1 | 7/2016 | Doris et al. |
| 2019/0081152 A1* | 3/2019 | Suh .................. H01L 29/66545 |
| 2019/0181338 A1* | 6/2019 | Hashemi ................ H10B 63/34 |
| 2020/0035678 A1* | 1/2020 | Lee ....................... H01L 29/775 |
| 2020/0052107 A1 | 2/2020 | Lie et al. |
| 2020/0287020 A1 | 9/2020 | Seo et al. |
| 2020/0303388 A1* | 9/2020 | Reznicek ........ H01L 21/823857 |
| 2021/0184001 A1 | 6/2021 | Trivedi et al. |

\* cited by examiner

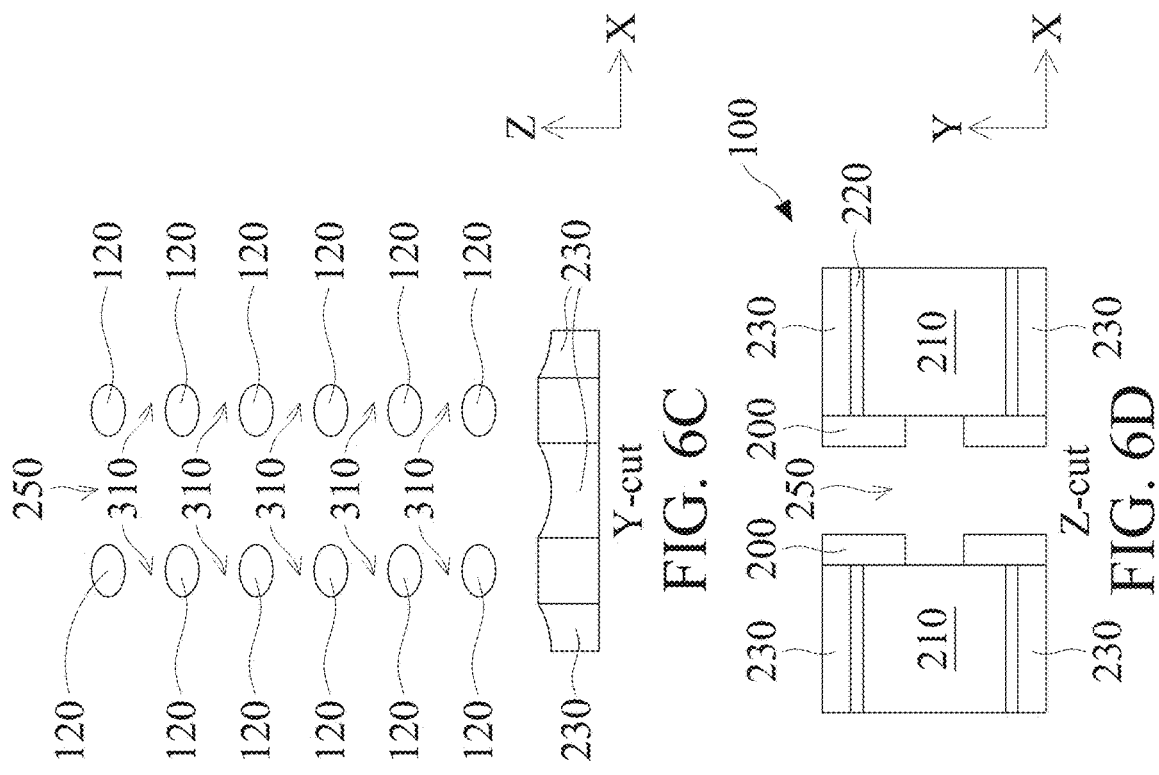
FIG. 6C
FIG. 6D
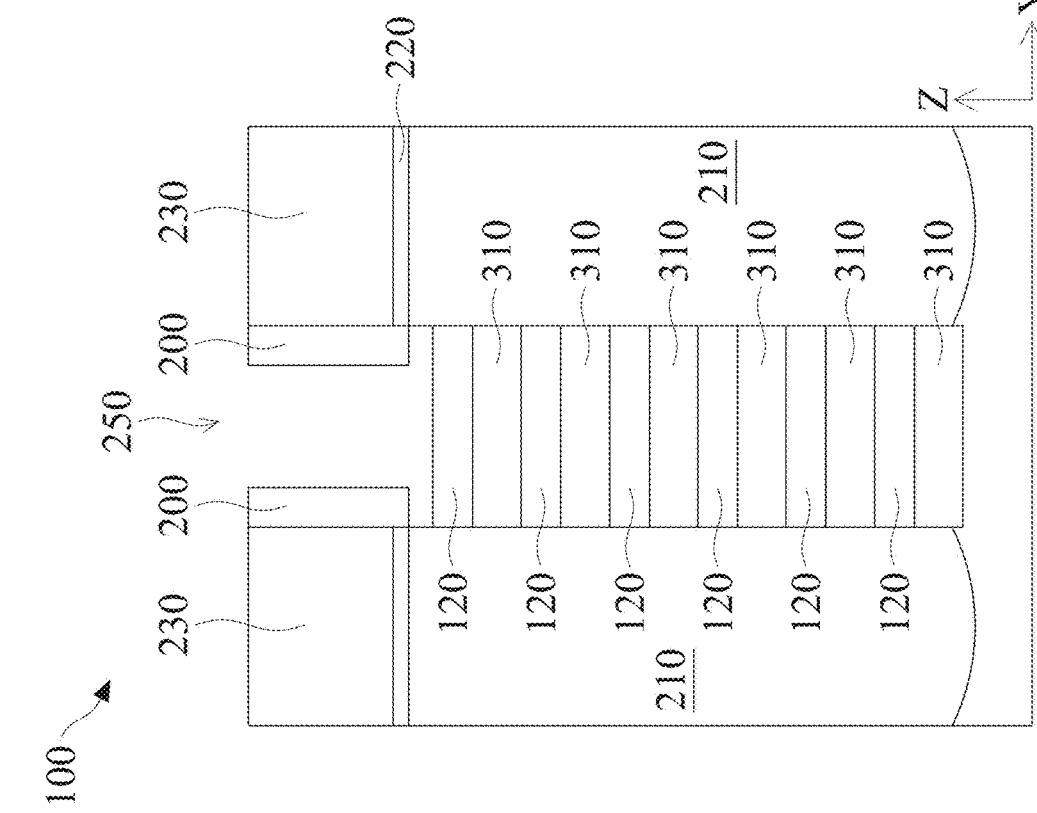
FIG. 6B

LOW RESISTANCE FILL METAL LAYER MATERIAL AS STRESSOR IN METAL GATES

PRIORITY

This is a continuation application of U.S. application Ser. No. 17/870,964, filed Jul. 22, 2022, which is a continuation application of U.S. application Ser. No. 16/717,433, filed Dec. 17, 2019, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing, and for these advancements to be realized, similar developments in IC processing and manufacturing are needed.

For example, multi-gate devices have been introduced in an effort to improve gate control by increasing gate-channel coupling, reduce OFF-state current, and reduce short-channel effects (SCEs). One such multi-gate device is gate-all-around (GAA) transistor, whose gate structure extends around its channel region providing access to the channel region on all sides. The GAA transistors are compatible with conventional complementary metal-oxide-semiconductor (CMOS) processes, allowing them to be aggressively scaled down while maintaining gate control and mitigating SCEs. However, conventional GAA devices may have an excessive resistance and work function variations, which could adversely degrade device performance. Additionally, conventional GAA devices may have gate formation margin issues which could present challenges to reliable fabrications. Therefore, although conventional GAA devices have been generally adequate for their intended purposes, they are not satisfactory in every respect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6B, 7B, 8B, and 10 are X-cut cross-sectional side views of semiconductor devices at various stages of fabrication according to various aspects of the present disclosure.

FIG. 6C is a Y-cut cross-sectional side view of semiconductor devices at various stages of fabrication according to various aspects of the present disclosure.

FIG. 6D is a Z-cut cross-sectional top or planar view of semiconductor devices at various stages of fabrication according to various aspects of the present disclosure.

DETAILED DESCRIPTION

Figure 1A:
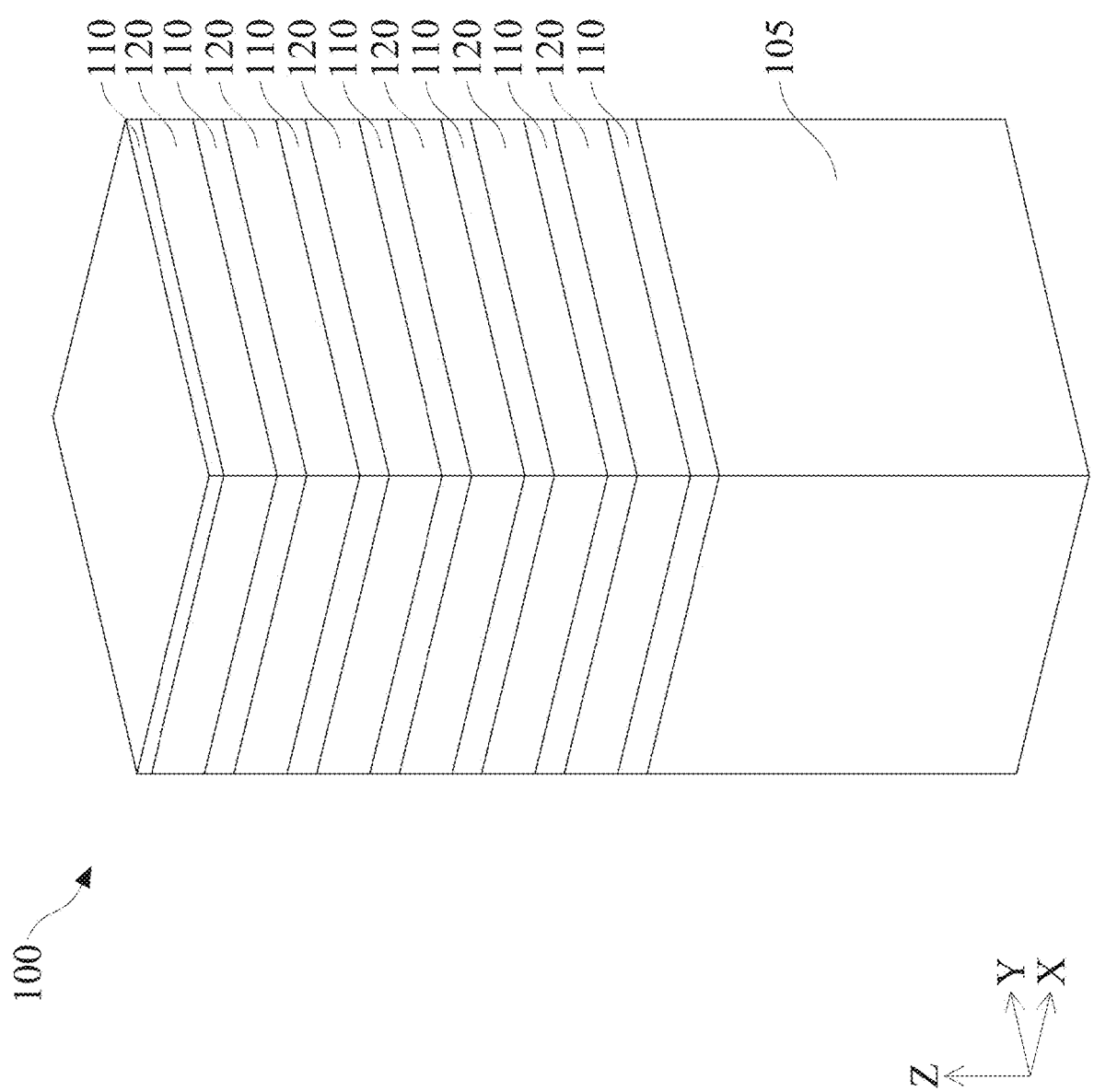
FIGS. 1A, 2A, 3A, 4A, 5A, 6A, 7A, and 8A are three-dimensional (3D) perspective views of semiconductor devices at various stages of fabrication according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to ICs and semiconductor devices as well as methods of forming the same. As technologies progress towards smaller technology nodes (for example, 20 nm, 16 nm, 10 nm, 7 nm, 5 nm, and below), the optimization of performance of ICs and semiconductor devices is increasingly limited by the competing demands for spaces to form different necessary features. Recently, GAA devices have been incorporated into the ICs and semiconductor devices in order to address this issue. A GAA device includes any device that has its gate structure, or portions thereof, formed on all-sides of a channel region (e.g. surrounding a portion of a channel region). A GAA device stacks multiple channels over a small region of the semiconductor chip so as to alleviate the challenge in scaling. GAA devices may also be referred to as multi-bridge channel devices.

However, GAA devices have their respective challenges. For example, GAA devices often have limited channel-to-channel spacings. Accordingly, features formed within the spacings (such as portions of a gate structure) also have limited dimensions, for example, within a nanometer regime. When conductive features have dimensions in the nanometer regime, their resistances often increase dramatically as compared to their resistances at bulk dimensions. In other words, material options optimized for conventional devices may not be the ideal choice for GAA devices. Additionally, the material options are further limited by various other parameters (such as work functions and/or stresses over the channel layers) in order to fulfill the design needs. Furthermore, as the device structures become more and more complex, it is desirable to consolidate features to perform multiple functions, and/or integrate process steps to simplify the fabrications. Optimizing and balancing all these factors have been a significant challenge while forming reliable devices. The present disclosure thus proposes new device structures and material options that improve upon the various considerations discussed above. For example, the present disclosure provides gate fill metal materials that have low resistance at the relevant dimension, desirable stress effects, and suitable work functions. Additionally, the provided gate fill metal materials enable simplified device structures and/or integrated processes that will contribute to a reduction in fabrication costs. Furthermore, the methods and materials disclosed herein allow for halogen-free processes, thereby improving the reliability of devices thus prepared. The present disclosure includes multiple embodiments. Different embodiments may have different advantages, and no particular advantage is necessarily required of any embodiment.

As described above, a GAA device includes a gate structure formed on all sides of a channel region. The channel region of a GAA device may include nanowire channels, nanosheet channels, nanobar channels, and/or other suitable channel configurations. In embodiments, the channel region of a GAA device may have multiple horizontal nanowires, nanosheets, nano-bars, and/or other suitably-shaped channels vertically spaced, making the GAA device a stacked horizontal GAA (S-HGAA) device. Furthermore, because such channels typically have dimensions in the nanometer regime, they are hereinafter collectively referred to as "nanochannels." The GAA devices may include p-type metal-oxide-semiconductor GAA devices or n-type metal-oxide-semiconductor GAA devices. Further, the GAA devices may have one or more channel regions associated with a single, contiguous gate structure, or multiple gate structures. One of ordinary skill may recognize other examples of semiconductor devices that may benefit from aspects of the present disclosure. For example, other types of metal-oxide semiconductor field effect transistors (MOSFETs), such as planar MOSFETs, FinFETs, other multi-gate FETs, complementary metal-oxide semiconductor transistors (CMOS) receive similar technical benefits as the GAA device described here.

Figure 9A:
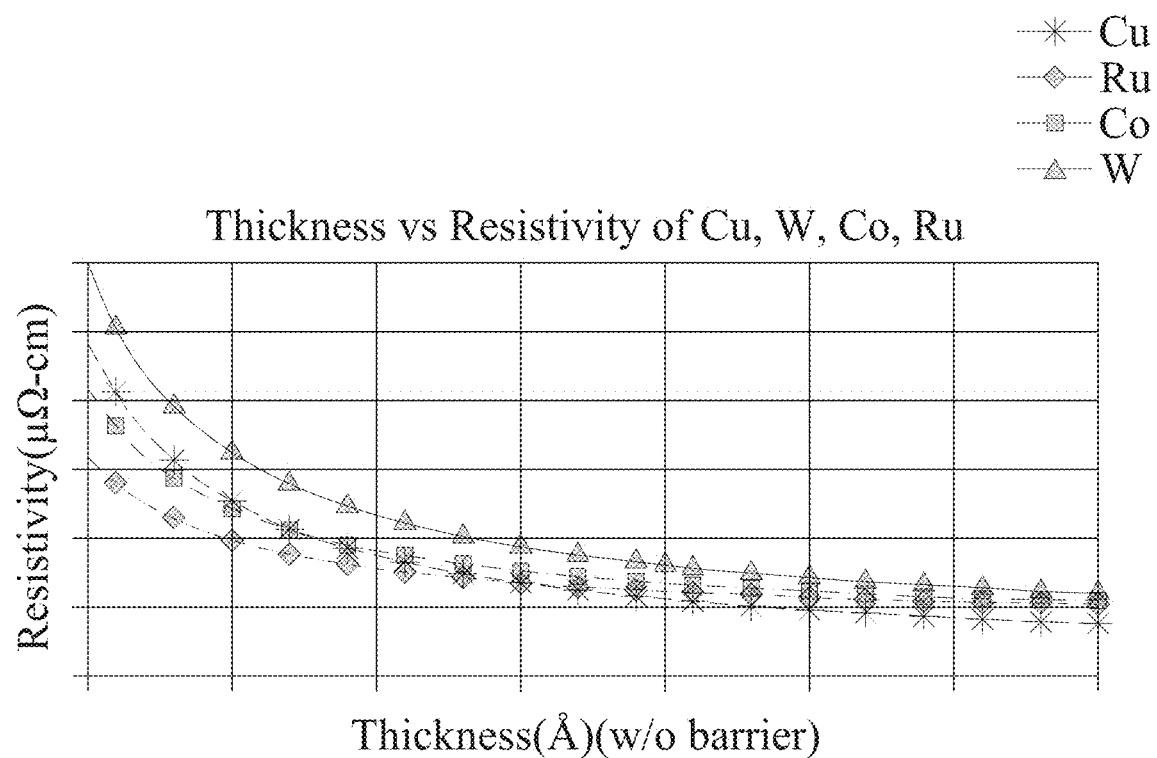
FIG. 9A is a diagram illustrating relationship between resistivity and feature thickness for several material options for gate electrode fill metal layers.
Figure 9B:
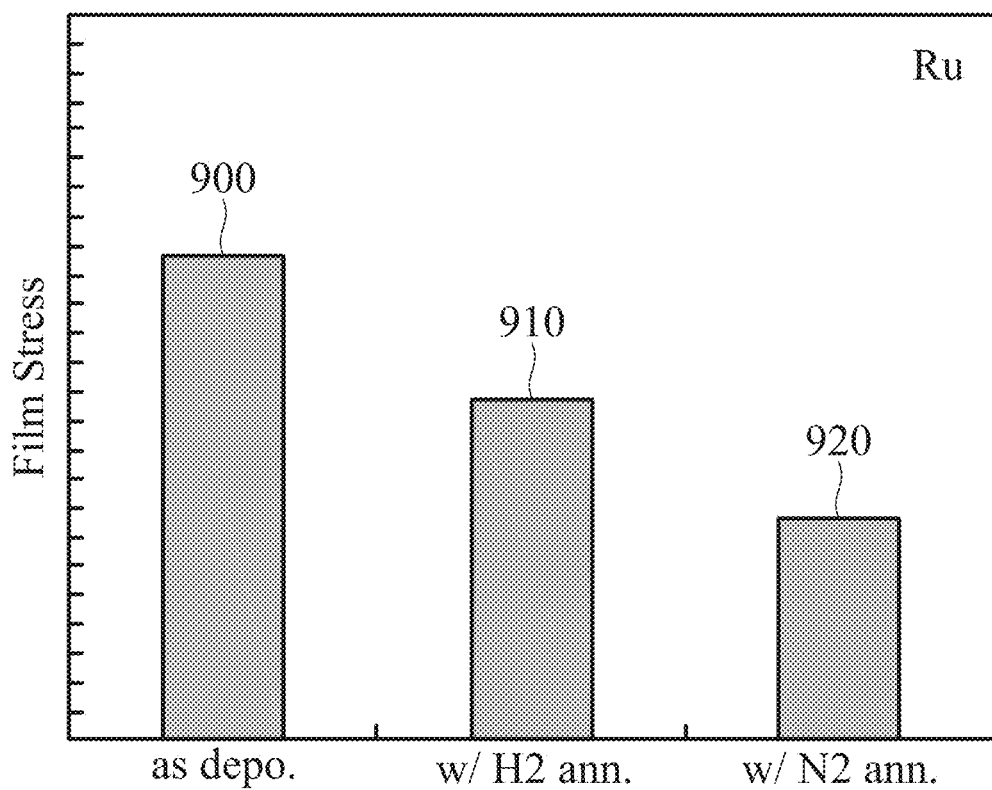
FIG. 9B is a diagram illustrating the effects of post-deposition annealing on the film stress for gate electrode fill metal layers.
Figure 10:
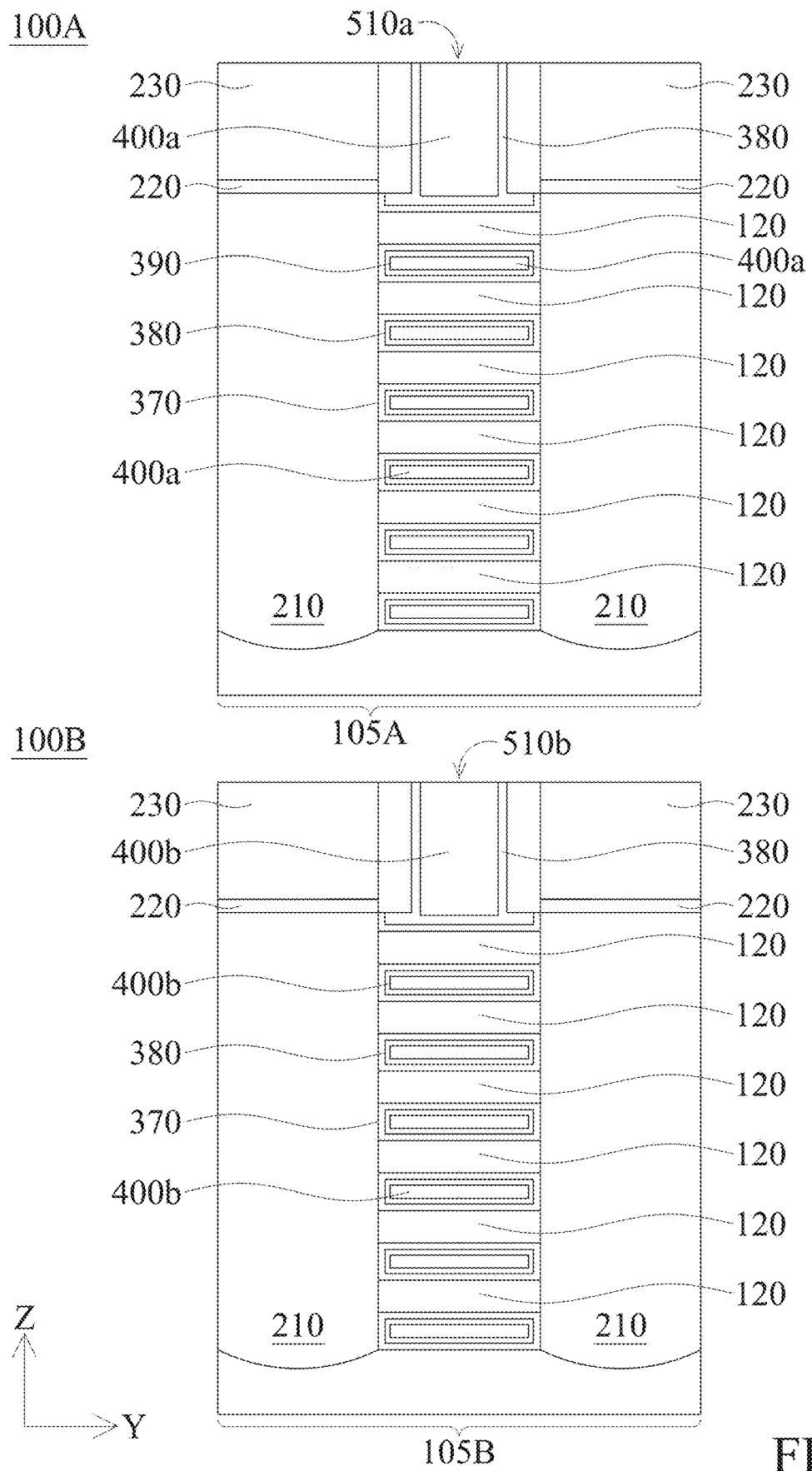
Figure 11:
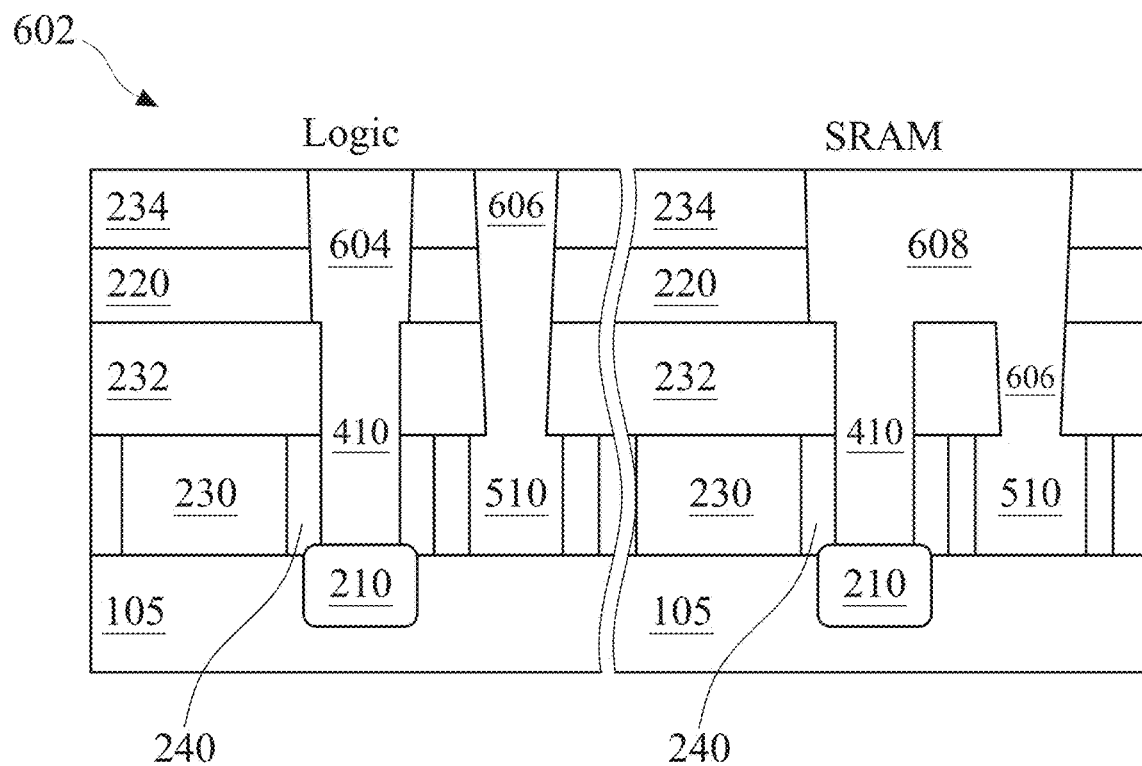
FIG. 11 is a cross-sectional view of an interconnection structure over semiconductor devices, in accordance with some embodiments.

FIGS. 1A-8A are three-dimensional (3D) perspective views of semiconductor devices at various stages of fabrication according to various aspects of the present disclosure. FIGS. 6B-8B, and 10 are X-cut cross-sectional side views of the semiconductor devices at various stages of fabrication according to various aspects of the present disclosure. FIG. 6C is a Y-cut cross-sectional side view of the semiconductor devices at various stages of fabrication according to various aspects of the present disclosure. FIG. 6D is a Z-cut cross-sectional top or planar view of the semiconductor devices at various stages of fabrication according to various aspects of the present disclosure. FIG. 9A is a diagram illustrating relationship between resistivity and feature thickness for several material options for the gate electrode fill metal layer. FIG. 9B is a diagram illustrating the effects of post-deposition annealing on the film stress for gate electrode fill metal layers. FIG. 11 is a cross-sectional view of an interconnection structure over the semiconductor devices, in accordance with some embodiments.

In the illustrated embodiments, the semiconductor devices include a GAA device (e.g. an HGAA device). The GAA device may be fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs, MOSFETs, CMOS, bipolar transistors, high voltage transistors, high frequency transistors, other memory cells, and combinations thereof.

Referring to FIG. 1A, the GAA device 100 includes a substrate 105. The substrate 105 contains a semiconductor material. In some embodiments, the substrate 105 may include different dopants in different regions. A plurality of semiconductor layers 110 and 120 are vertically stacked (along a "Z" direction shown in FIG. 1A) over the substrate 105 in an interleaving or alternating fashion. For example, a semiconductor layer 110 is disposed over the substrate 105, a semiconductor layer 120 is disposed over the semiconductor layer 110, and another semiconductor layer 110 is disposed over the semiconductor layer 120, so on and so forth. The material compositions of the semiconductor layers 120 and 110 are configured such that they have an etching selectivity in a subsequent etching process, as discussed in more detail below. For example, in some embodiments, the semiconductor layers 110 contains silicon germanium (SiGe), while the semiconductor layers 120 contain silicon (Si). In some other embodiments, the semiconductor layers 120 contain SiGe, while the semiconductor layers 110 contain Si.

Figure 2A:
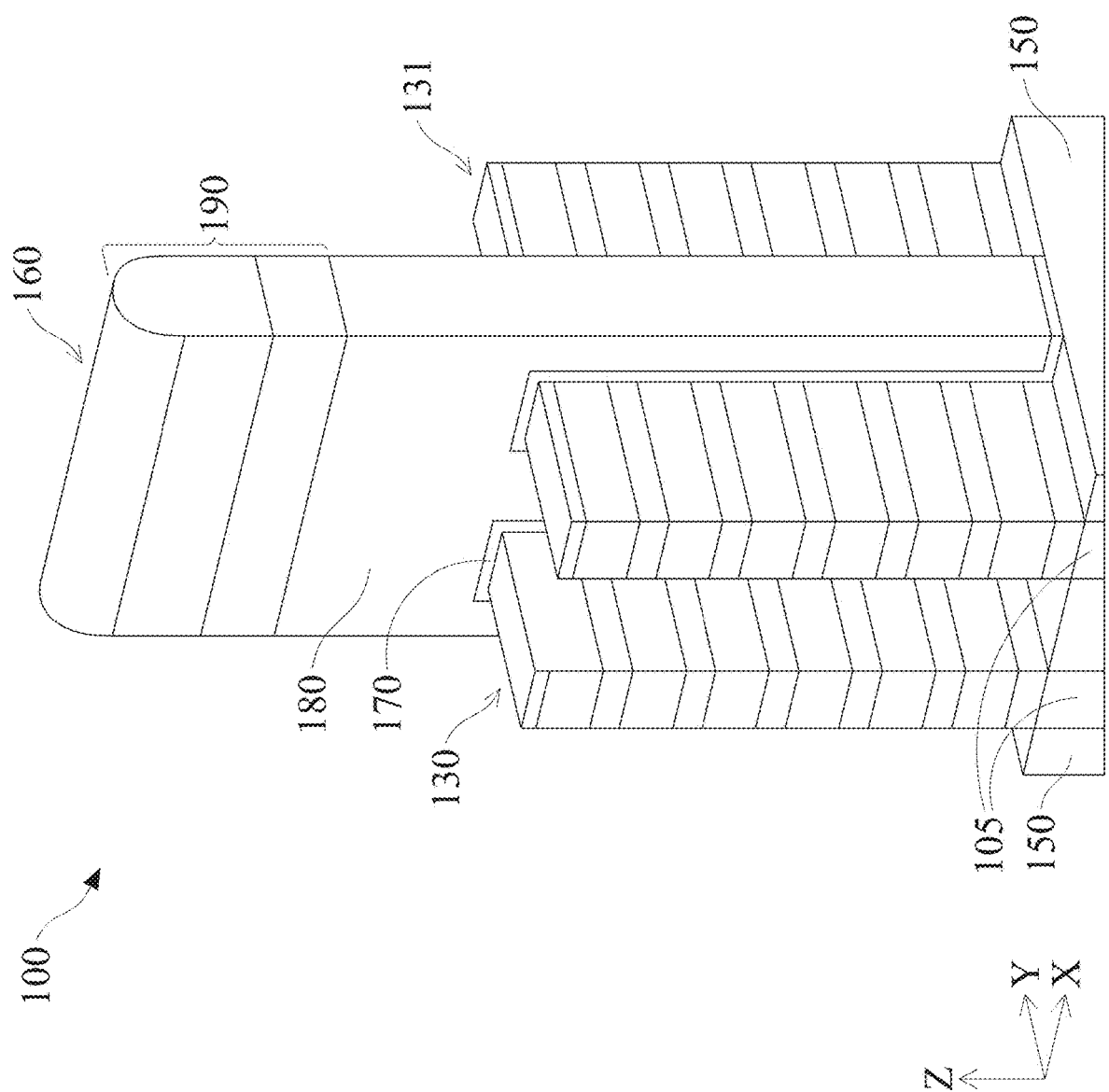

Referring now to FIG. 2A, one or more etching processes are performed to the GAA device 100 to pattern the stack of semiconductor layers 110 and 120 into a plurality of fin structures, for example into fin structures 130 and 131. The fin structures 130 and 131 may serve as active regions for subsequently formed devices. The fin structures (or fins) may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Accordingly, each of the fin structures 130-131 includes a stack of the semiconductor layers 110 and 120, where the semiconductor layers 110 and 120 are disposed in an alternating manner with respect to one another. The fin structures 130 and 131 each extend horizontally in a Y-direction and are separated from each other horizontally in an X-direction, as shown in FIG. 2A. It is understood that the X-direction and the Y-direction are horizontal directions that are perpendicular to each other, and that the Z-direction is a vertical direction that is orthogonal to a horizontal plane defined by the X-direction and the Y-direction. The etching processes performed to form the fin structures 130-131 may also etch away portions of the substrate 105. Isolation structures 150 are subsequently formed in place of the removed substrate 105. In some embodiments, the isolation structures 150 include a shallow trench isolation (STI). The isolation structures 150 may contain an electrically insulating material such as silicon oxide.

A dummy gate structure 160 is formed over a portion of each of the fin structures 130-131. The dummy gate structure 160 wraps around the top surface and side surfaces of each of the fin structures. The dummy gate structure 160 includes a gate dielectric layer 170 overlying the fin structures 130-131 and a dummy gate electrode layer 180 over the gate dielectric layer 170. The dummy gate structure 160 may also include one or more mask layers 190, which are used to pattern the gate dielectric layer 170 and the dummy gate electrode layer 180. In some embodiments, the gate dielectric layer 170 includes silicon oxide, and the dummy gate electrode layer 180 contains polysilicon.

Figure 3A:
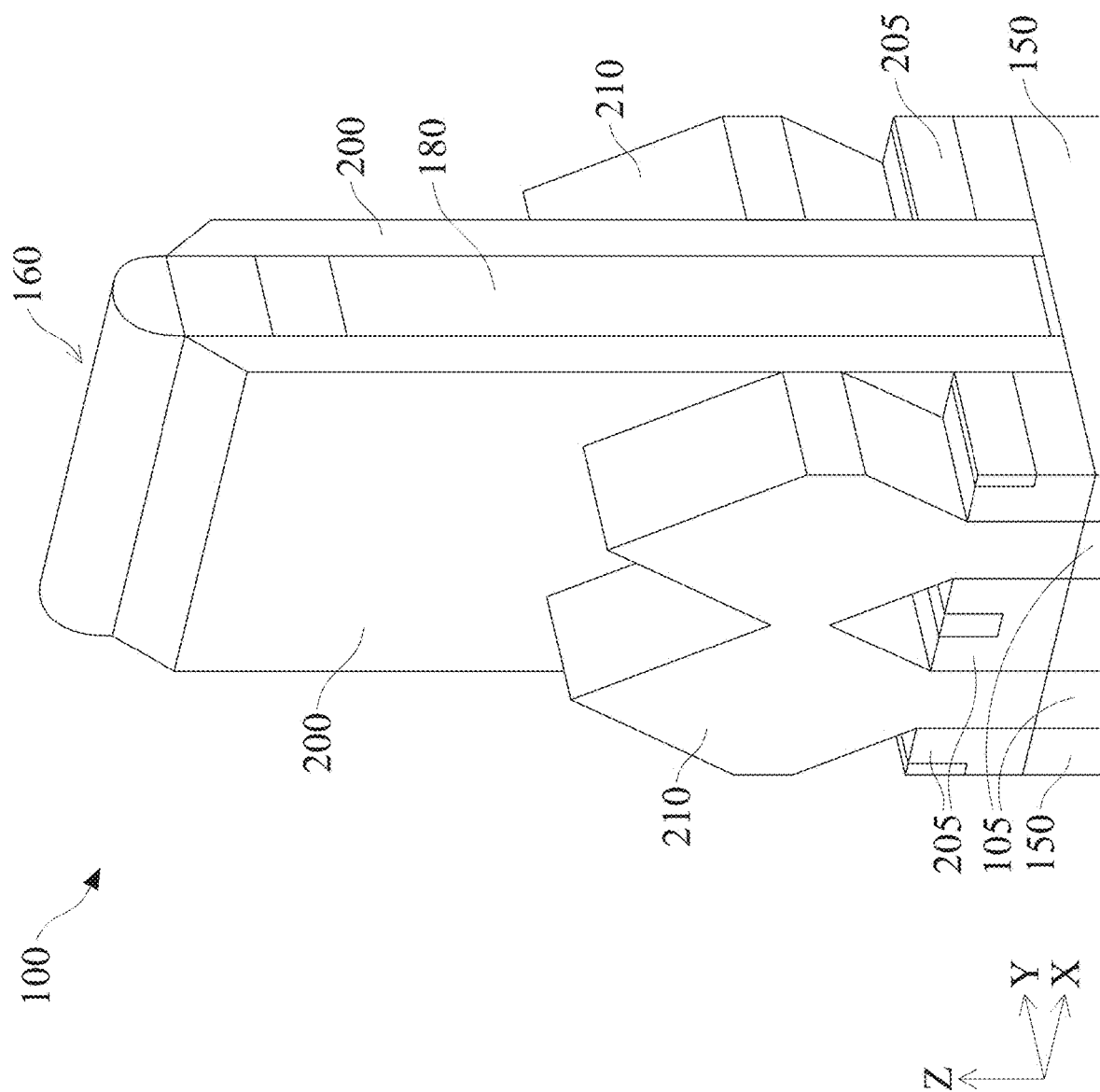

Referring now to FIG. 3A, gate spacers 200 may be formed on sidewalls of the dummy gate structure 160. The gate spacers 200 contain a dielectric material, for example silicon nitride, silicon oxide, silicon carbide, silicon oxycarbide, silicon oxycarbon nitride, a low-k dielectric material, or a combination thereof. The gate spacers 200 may be formed by any suitable methods, which may include depositions, etching, and/or chemical oxidations.

In addition, the portions of the fin structures 130-131 in the source/drain region outside of the dummy gate structure 160 are recessed. Epitaxial source/drain features 210 are formed in the recessed regions through an epitaxial growth process. In some embodiments, the epitaxial source/drain features may merge together, as shown in FIG. 3A. The epitaxial source/drain features 210 may be doped with suitable dopants. For example, epitaxial source/drain features for an n-type device may be doped with n-type dopants, such as phosphorous (P), arsenic (As), other n-type dopant, or combinations thereof; while epitaxial source/drain features for a p-type device may be doped with p-type dopants, such as boron (B), carbon (C), other p-type dopant, or combinations thereof. Additionally, the epitaxial source/drain features 210 may include suitable semiconductor materials for stress effects. In some embodiments, source/drain spacers 205 are also formed over the isolation structure 150. The source/drain spacers 205 may include a low-k dielectric material.

Figure 4A:
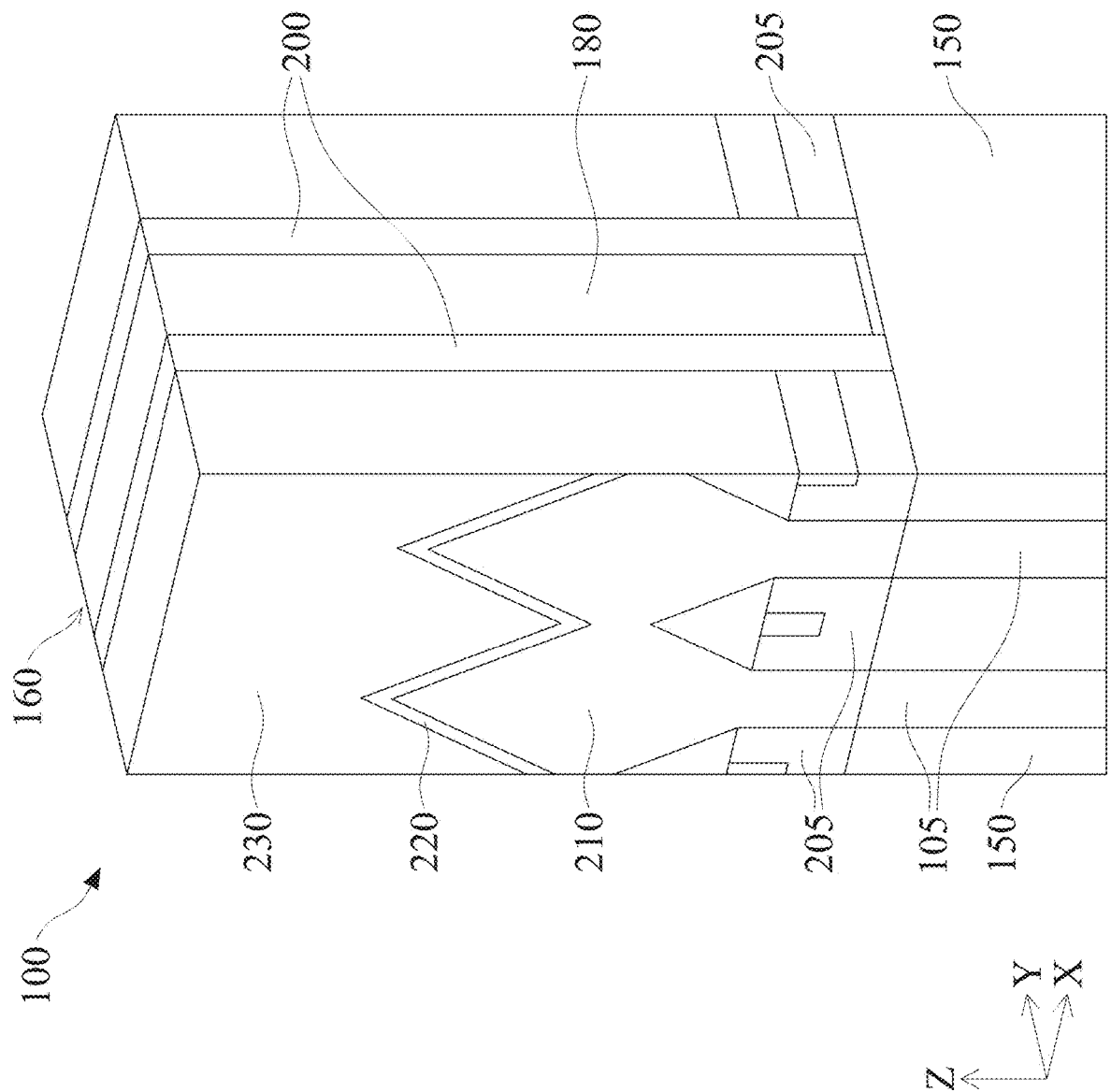

Referring now to FIG. 4A, an interlayer dielectric (ILD) layer 230 is formed over the epitaxial source/drain features 210. The ILD layer 230 may include a dielectric material, such as silicon oxide, silicon oxycarbide, a high-k material, a low-k material, or an extreme low-k material. Among other functions, the ILD layer 230 provides electrical isolation between the various components of the GAA device 100. In many embodiments, the ILD layer 230 has a thickness between about 50 nm and about 500 nm. The formation of the ILD layer 230 includes a deposition step and a chemical mechanical polishing (CMP) step. In some embodiments, a contact etching-stop layer 220 may be formed between the epitaxial source/drain features 210 and the ILD layer 230.

Figure 5A:
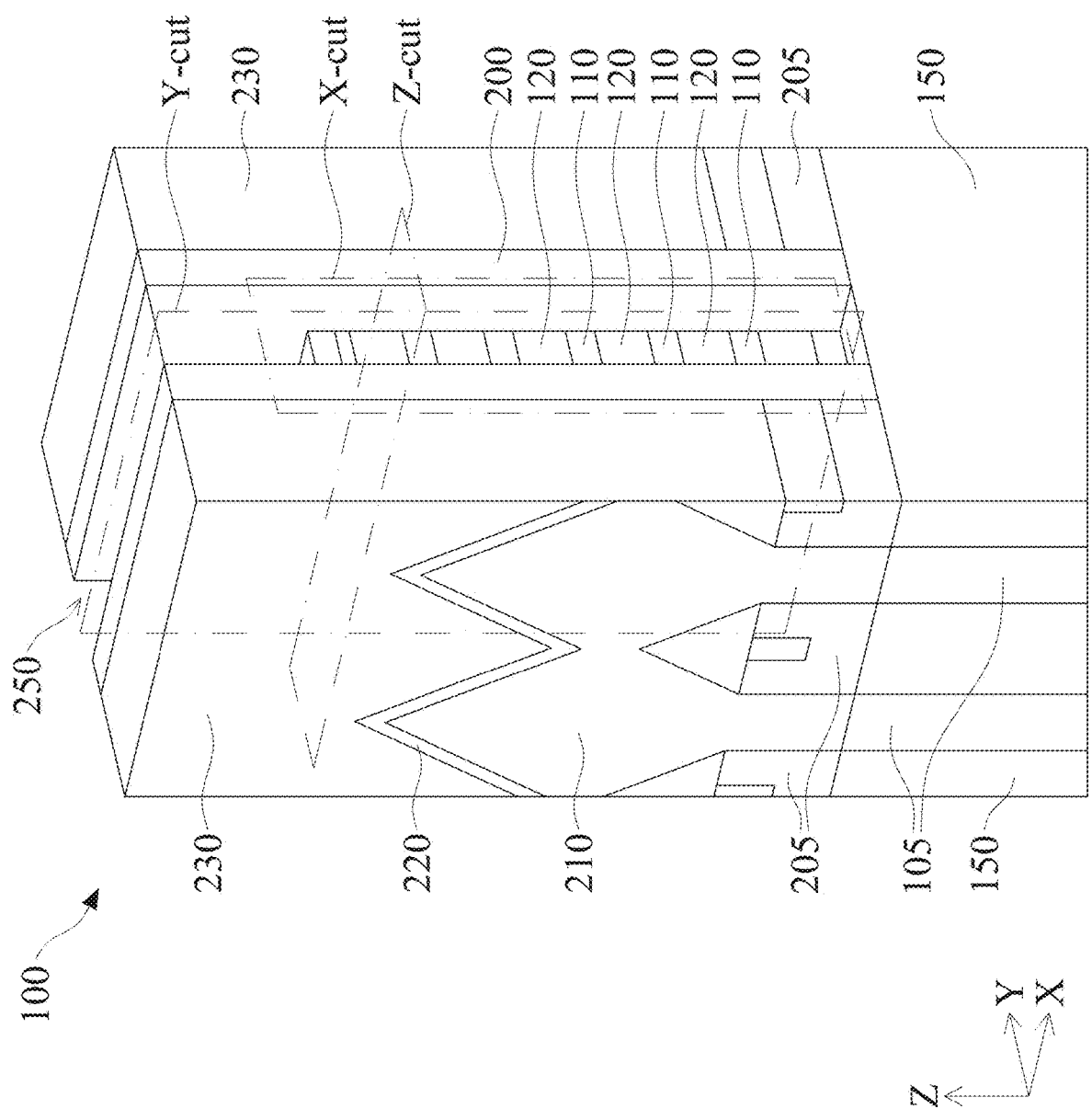
Figure 6A:
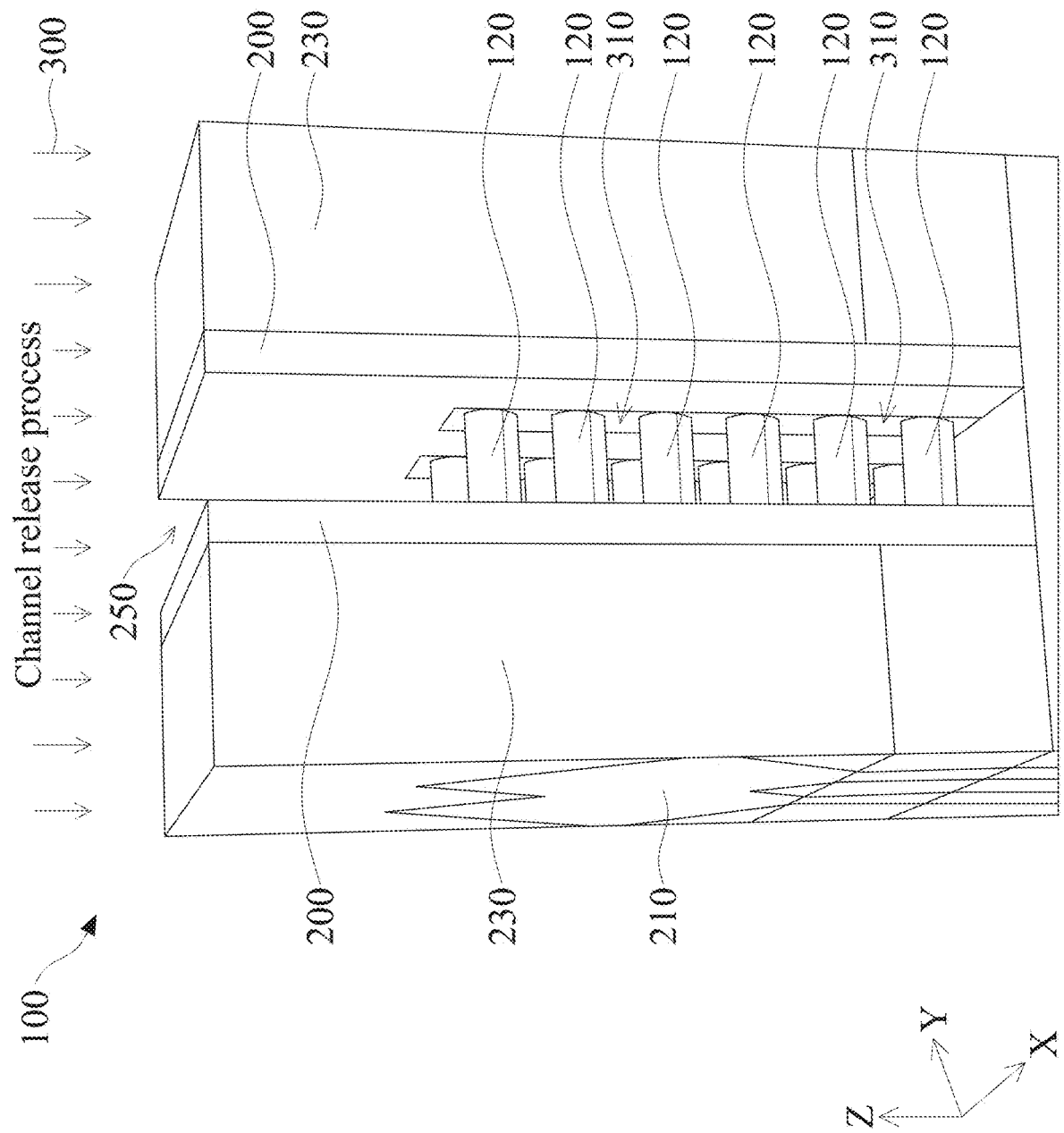

Referring now to FIGS. 5A, the dummy gate structure 160 is removed. FIG. 5A illustrates a perspective three-dimensional (3D) view of the GAA device 100 after the removal of the dummy gate structure 160. As illustrated, the removal of the dummy gate structure 160 forms a recess 250 in the GAA device 100. The recess 250 partially exposes the top and side surfaces of the fin structures 130 and 131.

Referring now to FIGS. 6A-6D, a channel release process 300 is performed to the GAA device 100. The channel release process 300 may include one or more etching processes (such as wet etching processes and/or dry etching processes) to remove the semiconductor layers 110, but not the semiconductor layers 120. As discussed above, this is made possible due to the different material compositions between the semiconductor layers 110 and 120. In other words, there is an etching selectivity between the semiconductor layers 110 and 120 as the channel release process 300 is performed. For example, the semiconductor layers 110 may be etched away at a substantially faster rate (e.g. 10 times or more) than the semiconductor layers 120.

The removal of the semiconductor layers 110 forms a stack of suspended semiconductor layers 120 surrounded by voids or gaps 310 in the GAA device 100. Thus, each of the semiconductor layers 120 is circumferentially exposed. Although etched at a much slower rate, the channel release process 300 may also reshape the semiconductor layers 120. For example, the channel release process 300 may cause each of the semiconductor layers 120 to have a more rounded or curved profile (see FIGS. 6A and 6C). It is understood that these semiconductor layers 120 may serve as the channel regions of the GAA device 100.

Figure 7A:
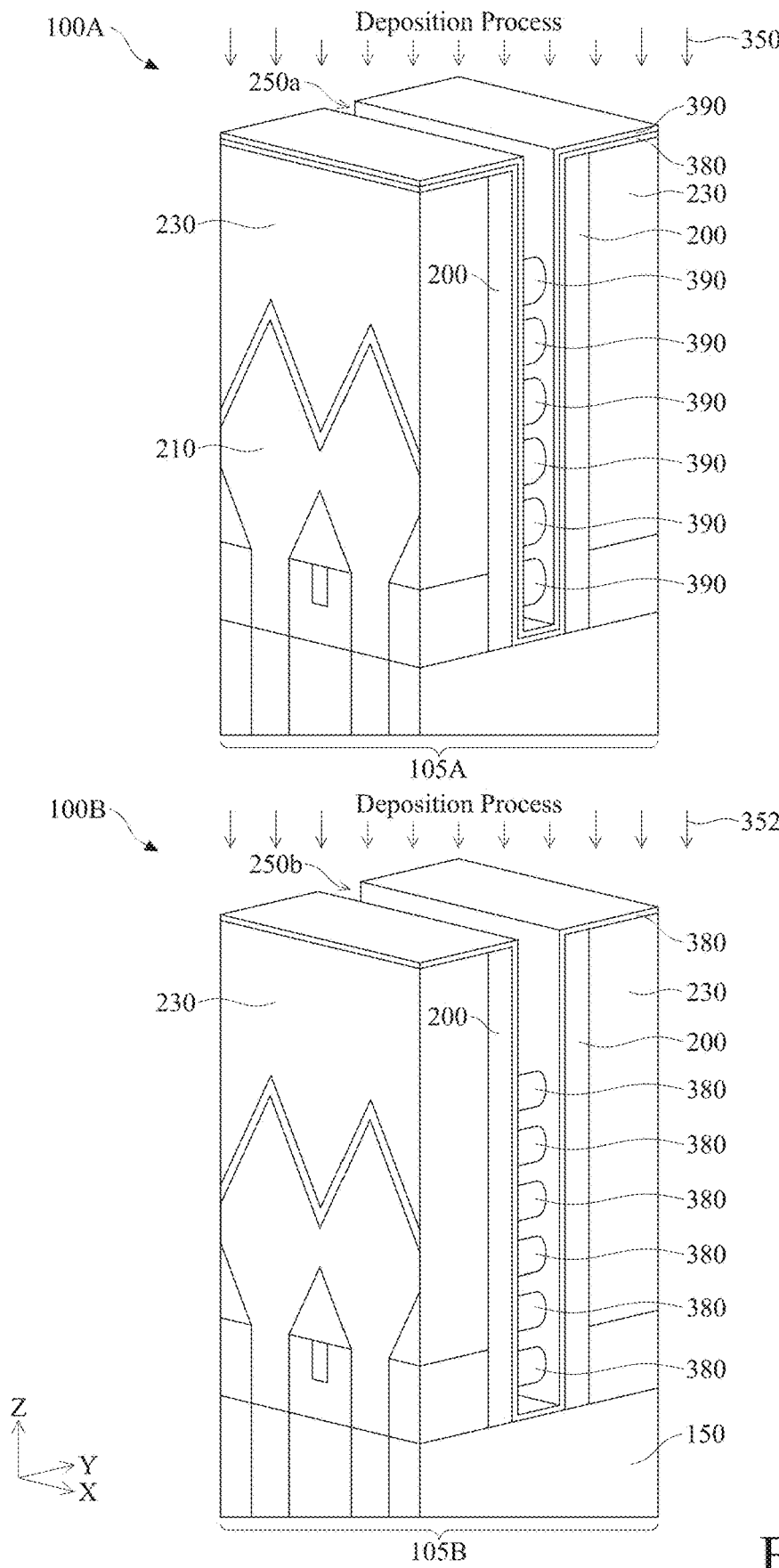
Figure 7B:
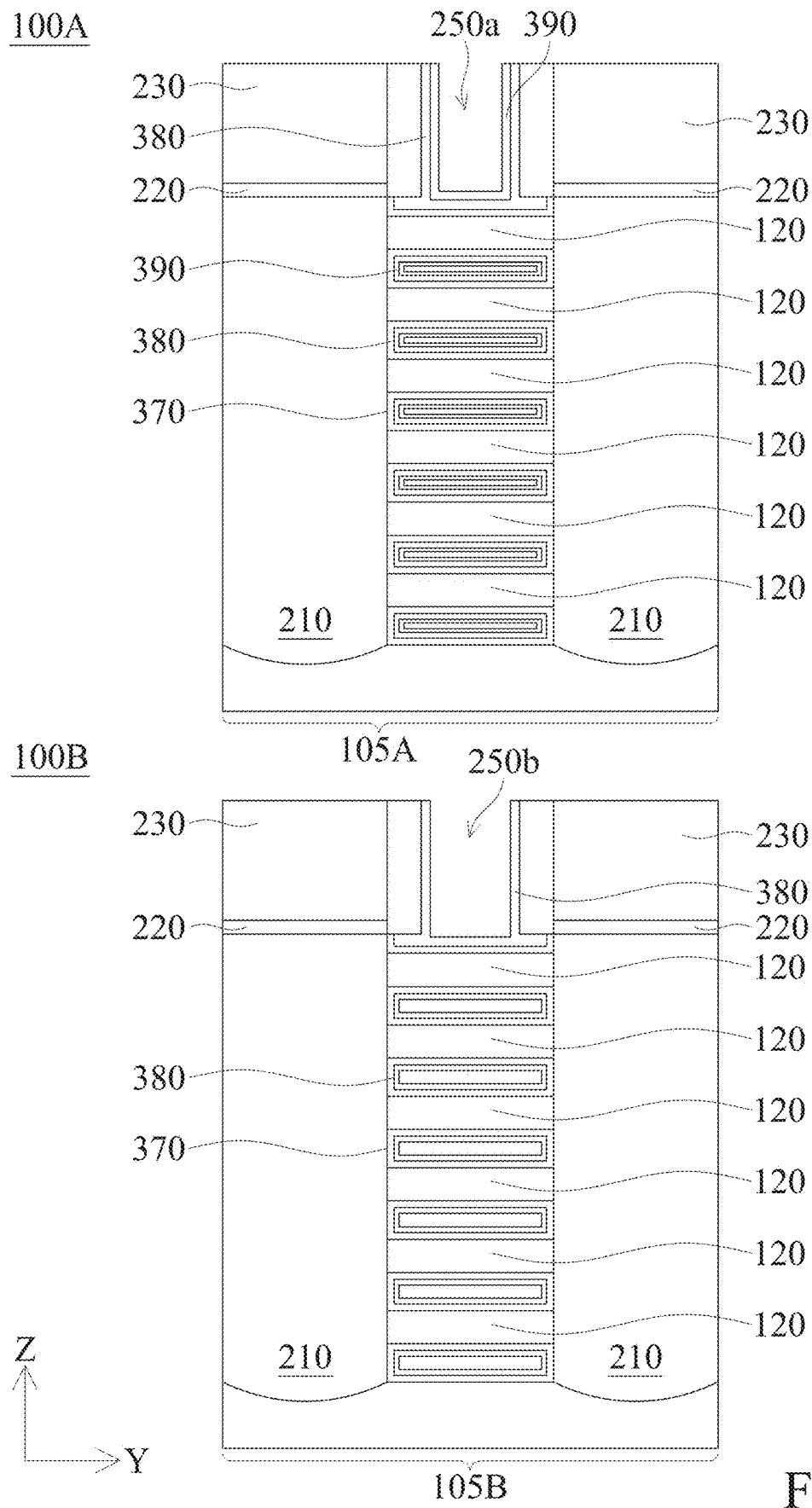

Referring now to FIGS. 7A-7B, GAA devices in different device regions may receive the same or different subsequent processing. For example, GAA device 100 in device region 105A (denoted as 100A) may receive a deposition treatment 350; while GAA device 100 in device region 105B (denoted as 100B) may receive a deposition treatment 352. Deposition treatments 350 and 352 each include multiple deposition steps and form multiple layers which at least partially fill the voids or gaps 310 left by the removal of the semiconductor layers 110. Deposition treatment 350 and deposition treatment 352 may be different treatment processes. The different processing may be achieved by forming a mask layer over a region the deposition treatment (or a deposition step of the deposition treatment) is not directed to, and subsequently remove the mask layer after its completion. However, in some embodiments, some deposition steps of deposition treatment 350 may be the same as some deposition steps of deposition treatment 352. Additionally, some deposition steps of deposition treatment 350 may be performed at the same time as some deposition steps of deposition treatment 352. In one embodiment, GAA device 100A is a p-type device, and GAA device 100B is an n-type device. In another embodiment, GAA device 100A is an n-type device, and GAA device 100B is a p-type device. The deposition treatments 350 and/or 352 may be any suitable processes such as CVD, physical vapor deposition (PVD), plasma-enhanced CVD (PECVD), metal-organic CVD (MOCVD), ALD, or combinations thereof.

The multiple layers formed by the deposition treatments 350 and 352 may each include dielectric layers that collectively form a gate dielectric over the semiconductor layers 120. For example, as shown in FIG. 7B, a dielectric layer 370 may be formed around the outer surfaces of each of the semiconductor layers 120, such that it wraps around each of the semiconductor layers 120 in 360 degrees. Also as shown in FIG. 7B, the dielectric layer 370 is formed to be in direct contact with sidewalls of the epitaxial source/drain features 210. The dielectric layer 370 may include a suitable dielectric material and may serve as an interfacial layer (IL), similar to the interfacial layers between the channel region and the gate structure for conventional transistors. In some embodiments, the dielectric layer 370 for the GAA device 100A and the dielectric layer 370 for the GAA device 100B are formed at the same time (or, in the same deposition process). In other words, the deposition steps forming the dielectric layer 370 for GAA device 100A and GAA device 100B are the same, even though other aspects of the deposition treatments 350 and 352 differ from each other.

Furthermore, the deposition treatments 350 and 352 each further form dielectric layer 380 on the dielectric layer 370 for both GAA devices 100A and 100B, such that it wraps around the dielectric layer 370 in 360 degrees. Therefore, two dielectric layers, dielectric layer 370 and dielectric layer 380, wrap around the semiconductor layers 120 in both device regions. Also as shown in the 3-D perspective view of FIG. 7A and the X-cut cross-sectional view of FIG. 7B, portions of the dielectric layer 380 are disposed on the sidewalls of the gate spacers 200. In some embodiments, the dielectric layer 380 contains a high-k dielectric material. It is understood that the dielectric layer 380 may serve a role similar to the high-k gate dielectric layer in conventional transistors. In some embodiments, the dielectric layer 380 for the GAA device 100A and the dielectric layer 380 for the GAA device 100B are formed at the same time (or, in the same deposition process). In other words, the deposition steps forming the dielectric layer 380 for GAA device 100A and GAA device 100B are the same, even though other aspects of the deposition treatments 350 and 352 differ from each other.

In the depicted embodiment, the deposition treatments 350 and 352 differ from each other in that the deposition treatment 350 includes forming a third layer 390 for GAA device 100A in device region 105A, while the deposition treatment 352 does not include this deposition step for GAA device 100B in device region 105B. For example, in the device region 105A, the third layer 390 may be formed on the dielectric layer 380 such that it wraps around the dielectric layer 380 in 360 degrees. Therefore, for GAA device 100A, three layers now wrap around the semiconductor layers 120, that is, dielectric layer 370, dielectric layer 380, and third layer 390. By contrast for GAA device 100B, no third layer 390 is formed. Accordingly, still only two layers wrap around the semiconductor layers 120, that is, the dielectric layer 370 and the dielectric layer 380.

The third layer 390 may be a work function metal layer. Therefore, the third layer 390 may be interchangeably referred to as the work function metal layer 390. In one embodiment, the GAA device 100A is an n-type device, and the GAA device 100B is a p-type device. In other words, the work function metal layer 390 is formed in an n-type device but not in a p-type device. Accordingly, the work function metal layer 390 may be an n-type work function metal layer. In some embodiments, the work function metal layer 390 includes titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN), or combinations thereof. In some embodiments, the work function of the n-type work function metal layer 390 is lower than the midgap (or midpoint of the band gap) of the semiconductor substrate, for example, lower than about 4.1 eV to about 4.3 eV.

In another embodiment, the GAA device 100A is a p-type device, and the GAA device 100B is an n-type device. In other words, the work function metal layer 390 is formed in a p-type device but not in an n-type device. Accordingly, the work function metal layer 390 may be a p-type work function metal layer. The work function metal layer 390 includes titanium nitride (TiN), ruthenium (Ru), iridium (Ir), osmium (Os), rhodium (Rh), or combinations thereof. In some embodiments, the work function of the p-type work function metal layer is greater than the midgap (or midpoint of the band gap) of the semiconductor substrate, for example, greater than about 4.6 eV to about 4.8 eV. The work function metal layer 390 may be configured to tune the work function of the gate electrode, thereby tuning a threshold voltage of a transistor in the n- or p-type region, for example by incorporating dopants. The work function metal layer 390 may include a plurality of layers and may be deposited by ALD, CVD, and/or other suitable process.

Figure 8A:
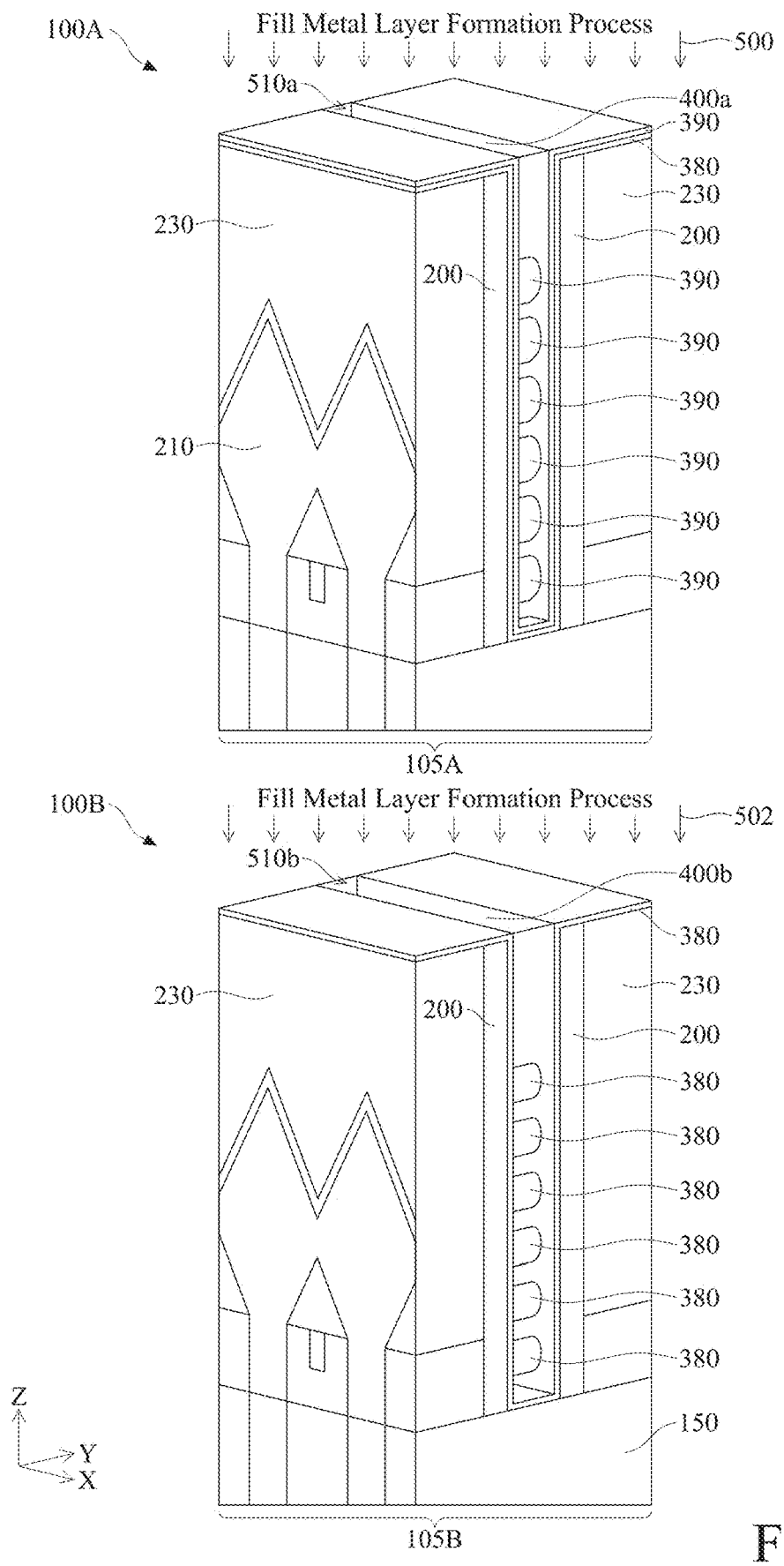
Figure 8B:
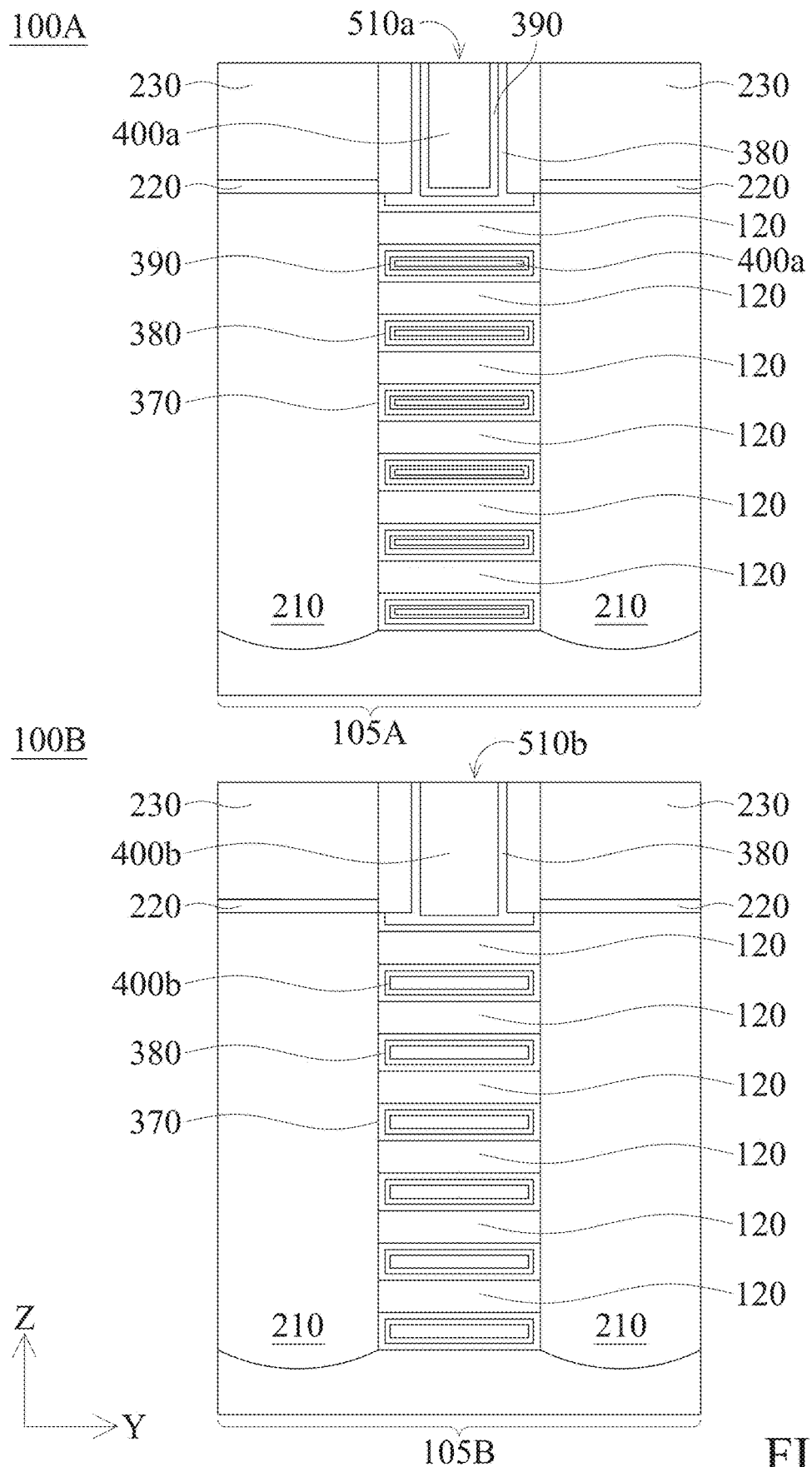

Referring now to FIGS. 8A-8B, a fill metal layer 400 is formed over a top layer of the semiconductor layers 120 for both GAA devices 100A and 100B. The fill metal layer 400 of the GAA device 100A is denoted as fill metal layer 400a; and the fill metal layer 400 of the GAA device 100B is denoted as fill metal layer 400b. The fill metal layers 400a and 400b may each serve as the main electrically conductive portion of the respective metal gate electrode. The fill metal layer 400a is formed over the work function metal layer 390 of the GAA device 100A, and the fill metal layer 400b is formed over the dielectric layer 380 of the GAA device 100B. Note that the fill metal layers 400a and 400b are illustrated as mostly transparent structures in FIGS. 8A-8B, so as to more clearly illustrate the various components over which the fill metal layer 400 is formed.

As illustrated in FIGS. 8A-8B, the fill metal layer 400a extends vertically continuously from the outer surface of the work function metal layer 390 to the top of the gate trench (e.g. the recess 250a), and extends horizontally continuously from a vertical surface (or, sidewall) of the work function metal layer 390 to an opposite vertical surface of the work function metal layer 390. The fill metal layer 400a and the work function metal layer 390 collectively form a metal gate electrode as part of a metal gate structure 510a. Similarly, the fill metal layer 400b extends vertically continuously from the outer surface of the dielectric layer 380 to the top of the gate trench (e.g. the recess 250b), and extends horizontally continuously from a vertical surface (or, sidewall) of the dielectric layer 380 to an opposite vertical surface of the dielectric layer 380. The fill metal layer 400b alone may form the metal gate electrode as part of a metal gate structure 510b.

The fill metal layers 400a and 400b may include any suitable fill metal materials, such as aluminum (Al), copper (Cu), cobalt (Co), tungsten (W), ruthenium (Ru), iridium (Ir), osmium (Os), rhodium (Rh), molybdenum (Mo), nickel (Ni), or combinations thereof. Any suitable methods may be used to form the fill metal layers 400a and 400b. This includes ALD, CVD, PVD, plating, and/or other suitable processes. In some embodiments, the fill metal layers 400a and/or 400b may be doped to tune the work function of the metal electrode, thereby adjusting the threshold voltages of the GAA device 100A and/or 100B. For example, the fill metal layer 400a and/or 400b may include a doped Ru film. Ru metal has a work function of about 4.6 eV to about 4.8 eV, and Ru metal including the oxygen dopant may have a work function of about 5.0 eV to about 5.2 eV. Therefore, by including an oxygen-doped Ru film, higher work function may be achieved for the fill metal layer 400a and/or 400b. In some embodiments, aluminum (Al) and/or yttrium (Y)

may be introduced as alternative or additional dopants in order to achieve the desired work functions.

As described above, the fill metal layers 400*a* and 400*b* may include different materials. This may be based on different design needs of the different GAA devices. In some embodiments, the fill metal material is chosen from Ru, Ir, Os, Rh, Mo, Ni, or combinations thereof. These fill metal materials provide one or more advantages of: (1) low resistance, (2) suitable stress effect, (3) simplified device structures. These advantages are described in more details below.

In some implementations, the use of Ru, Ir, Os, Rh, Mo, and/or Ni provides fill metal layers with lower resistances. As described above, one challenge presented to the conventional GAA device fabrication is the relatively high resistance of the conductive materials in the fill metal layer. High resistances lead to large, and sometimes intolerable, drops in voltage across the length of the conductive features, and as a result, lead to degraded reliability, performance, or even functionality. The high resistance may be the result of a high resistivity of the fill metal layer. While the resistivity parameter is generally considered a constant for a specific material at a bulk dimension, that approximation breaks down at the limit of a small dimension. The small dimension limit may be reached when the feature size approaches the order of the electron mean free path (MFP) of the feature material.

In that regard, MFP is a material property defined as the average distance travelled in the bulk material by a moving an electron between successive impacts (collisions), that modify its direction or energy or other particle properties. When semiconductor features are of dimensions similar to or below the MFP, scattering occurs at the material interfaces and grain boundaries. For example, scattering may occur at the sidewalls of a fill metal layer of a GAA device that interfaces a nanochannel, causing undesirable increase in the resistivity of the gate electrode. While such an increase is negligible when the feature size vastly exceeds MFP, it becomes substantial or even determinative when the feature size approaches MFP. This is the so-called classical resistivity size effect. Furthermore, the smaller the feature size is, the more important the scattering effect is towards the overall resistivity.

Different materials have different MFPs. It has been reported that Cu has a MFP of 39.9 nm, Co has a MFP of 7.77 nm, and W has a MFP of 15.5 nm. Therefore, in the context of GAA devices with small features (such as features with sizes of 3 nm or less), the classical resistivity size effect is crucial in evaluating the actual resistivity of the material. The actual resistivities of certain fill metal materials have been evaluated based on resistivity modeling (see FIG. 9A). For example, Cu, Co, and W at a thickness of about 20 nm each has a resistivity of about 7.5 μΩ-cm, 12 μΩ-cm, and 10 μΩ-cm, respectively. The same materials at 3 nm thickness each has a resistivity of about 42 μΩ-cm, 51 μΩ-cm, and 36 μΩ-cm, respectively. In comparison, Ru has a resistivity of about 10 μΩ-cm at a 20 nm thickness and about 28 μΩ-cm at a 3 nm thickness. Therefore, metals like Ru provide better resistivity profiles and may be better candidates for fill metal layer materials at these small dimensions. As the dimension further reduces below 3 nm, the superiority of Ru over the conventional metals further increases.

It has been found that when the feature size is on the order of or smaller than the MFP, metals having a small r parameter provide smaller resistivities. The r parameter takes into account both the bulk resistivity (ρ) and the MFP (λ), and is defined as the calculated product of the two factors, according to the equation:

$$r = \rho * \lambda$$

Therefore, even though some of the disclosed materials here do not have the lowest bulk resistivity ρ as compared to the conventional materials (e.g. the bulk resistivity ρ for Ru, Rh are about 7.8 μΩ-cm, and 4.7 μΩ-cm, respectively, while that of Cu is about 1.7 μΩ-cm), their favorable MFPs λ dominate the overall effect and result in lower actual resistivity at the relevant small dimension regime. The parameter r for Ir, Rh, Ni, Ru and Os has been found to be about 3.69 μΩ-cm-nm, 3.23 μΩ-cm-nm, 4.07 μΩ-cm-nm, 3.81 μΩ-cm-nm, and 4.33 μΩ-cm-nm, respectively. In comparison, the r parameter for Cu, W, and Co are at about 6.7 μΩ-cm-nm, 8.2 μΩ-cm-nm, and 4.82 μΩ-cm-nm, respectively. Generally, the smaller the r parameter is, the more desirable the material is with regard to resistance performances. Through theory and experiments, it has been found that an r parameter below about 4.5 μΩ-cm-nm is needed to realize the benefit of the present embodiment.

In some implementations, the use of some of the materials disclosed herein (such as Ru) provide suitable stress effects and are particularly advantageous with respect to increasing the hole carrier mobility in the p-type device. It is understood that the metal gate, particularly the fill metal layer asserts a stress over the channel region and may affect the carrier mobility of the device, much like the stress effect asserted by epitaxial source/drain features. Generally, tensile stress increases the electron carrier mobility, therefore is beneficial for n-type devices; while compressive stress increases the hole carrier mobility, therefore is beneficial for p-type devices. Such phenomena originate from the changed energy levels within the material.

Ru has a coefficient for thermal expansion (CTE) larger than the semiconductor layers 120. Therefore, the Ru fill metal layer 400*a* and/or 400*b* asserts a compressive stress over the channel region. The compressive stress causes the semiconductor lattice within the semiconductor layers 120 to lose symmetry, which leads to splitting of the energy levels available to the hole carriers. For example, some of the energy levels previously accessible by the hole carriers' randomized scattering are pushed higher in energy thus are no longer accessible by simple randomized scatterings. As a result, randomized scattering is suppressed. At the same time, some of the energy levels used in the hole carrier's directional movements are pushed lower in energy, thus directional movements are promoted. Both these effects lead to an increased overall hole conduction within the Ru fill metal layer 400*a* and/or 400*b*. Conversely, the same stress has an opposite effect on electron conductions and lead to a reduced overall electron conduction within the Ru fill metal layer 400*a* and/or 400*b*. Accordingly, it is desirable to increase the magnitude of the stress in a p-type GAA device, and to reduce the magnitude of the stress in an n-type GAA device.

The magnitude of the stress asserted by the Ru fill metal layer 400*a* and/or 400*b* may be tuned by adjusting processing parameters, such as the deposition temperature, anneal ambient, and/or the post-deposition annealing temperature. Generally, a semiconductor device experiences minimal stress at the deposition and/or annealing temperature due to the high mobility of the material. As the device cools down, the different material layers contracts to a different extent due to their different CTEs, and stress is created in this process. Since Ru has a CTE larger than the semiconductor layers 120, it contracts more than the semiconductor layers 120, asserting a compressive stress over the channel region. Meanwhile, the Ru fill metal layer 400*a* and/or 400*b* experiences tensile stress. The amount of stress thus produced is a function of the magnitude of the temperature drop between deposition and ambient, and therefore, can be tuned by adjusting the deposition and/or post-deposition annealing temperature. For example, assuming the Ru fill metal layer 400*b* is deposited over the channel regions of a semiconductor layer 120 at an elevated temperature $T_e$, and the Ru fill metal layer material has a Young's modulus Y and a CTE of $\alpha_M$, the stress $\sigma$ may be calculated as:

$$\sigma = Y \cdot (T_e - T_{RT}) \cdot (\alpha_M - \alpha_S)$$

wherein $\alpha_S$ is the CTE of the material in the semiconductor layer, and $T_{RT}$ is the ambient temperature. For example, FIG. 9B illustrates the effect of annealing ambient. In this example, a Ru film is formed as the fill metal layer. The bar 900 illustrates the amount of film stress in a sample that has not gone through a post-deposition annealing step. The bar 910 illustrates the amount of film stress in a sample that has gone through a post-deposition annealing at a temperature of about 450° C., with an annealing ambient that includes hydrogen gas ($H_2$). The bar 920 illustrates the amount of film stress in a sample that has gone through a post-deposition annealing at a temperature of about 450° C., with an annealing ambient that includes nitrogen gas ($N_2$) only. Alternatively, the stress may also be tuned by doping the fill metal layers with platinum (Pt), nitrogen (N), tungsten (W), molybdenum (Mo), cobalt (Co), and/or other suitable dopants. Through theory and experiments, it has been found that a stress of at least about 70 MPa to about 80 MPa is generally needed to achieve the desired benefit of this embodiment. A planarization process (such as a CMP process) may be performed to expose the top surface of the ILD layer 230.

In some implementations, the use of Ru, Ir, Os, Rh, Mo, and/or Ni provides simplified device structures and maximized formation margins for p-type devices. As described above, GAA device 100B does not include a work function metal layer. Rather, the fill metal layer 400*b* directly interfaces with and contacts the dielectric layer 380. However, a bottom portion of the fill metal layer 400*b* may perform some of the functions of the work function metal layer. For example, the GAA device 100B is a p-type device, and the fill metal layer 400*b* includes Ru. Ru has a work function of approximately 4.7 eV and thus is a material suitable to perform the function of a p-type work function metal layer. Therefore, a p-type GAA device 100B does not need a separate p-type work function metal layer. Rather, the Ru fill metal layer 400*b* serves the dual function of being the p-type work function and the fill metal layer at the same time. Accordingly, by integrating the work function metal layer with the fill metal layer into one contiguous layer, the device structure is simplified and production cost reduced.

Furthermore, the use of these material also eliminates the need for additional assisting layers (such as barrier layers, blocking layer, liner layer, capping layer, and/or adhesion layer) and further frees up space for a larger filling window. In conventional schemes, the various additional layers are needed either to prevent cross-diffusions between different materials, or to protect the materials from fluorine and/or oxygen attacks. Their presence, however, takes up valuable spaces within the GAA devices and present significant fabricability challenges. For example, the filling metal materials for the fill metal layer 400*a* and/or 400*b* may experience more flow resistance than devices without such additional layers. Forming re-entrant features, such as between nanochannels, may be more challenging as the filling metal experiences more restrictions in movement due to the reduced opening sizes. As a result, the fill metal layer 400*b* as formed may include large amounts of defects (such as air gaps). Through experiments, however, it was discovered that the cross-diffusion or fluorine/oxygen attack issues are minimized when certain materials, such as Ru, Ir, and Rh, are used as the fill metal material, even in absence of such additional layers. This may be due to their favorable diffusion characteristics as compared to the conventional fill metals. Therefore, for example, a Ru fill metal layer may be formed to directly contact an n-type or a p-type work function metal layer without the concern for cross-diffusions between layers. The absence of extra layers allows larger spaces for filling and improves both resistance characteristics and device fabricability. Of course, such improvement in fabricability is in addition to that resulted from the elimination of the work function metal layers, as described above. Furthermore, the disclosed materials herein (such as Ru and/or Al) also have better reflow properties as compared to conventional materials. As such, the filing of narrow spacing and re-entrant features may be further improved.

Alternatively, in some embodiments, the fill metal layer 400*a* and/or 400*b* may include aluminum (Al). Al also provides good reflow property and relatively low resistance, as well as allows for tuning of the tensile stress over channel layers in the n-type devices. For example, GAA device 100B is an n-type device, and the fill metal layer 400*b* includes Al. The fill metal layer 400*b* may be formed by any suitable processes, such as those described above in the context of Ru. An implantation process is conducted on the fill metal layer 400*b* such that the fill metal layer 400*b* asserts a tensile stress over the channel layers. Similar to the compressive stress in the case of Ru, the tensile stress asserted by Al increases overall electron conduction within the Al fill metal layer 400*b*. The implanted dopant may be selected from Al, Si, Ge, and any other suitable elements. The magnitude of the stress asserted by the Al fill metal layer 400*b* may be tuned by adjusting the dose of the implant.

Additionally, the use of aluminum also similarly provides simplified device structure and maximized formation margins for n-type devices. In one implementation, the GAA device 100B is an n-type device, and the fill metal layer 400*b* includes Al. Al has a work function of has a work function of approximately 4.2 eV and thus is a material suitable to perform the function of an n-type work function metal layer. Therefore, an n-type GAA device 100B does not need a separate n-type work function metal layer. Rather, the Al fill metal layer 400*b* serves the dual function of being the n-type work function and the fill metal layer at the same time. Tuning of the work function of the metal electrode may be achieved by incorporating dopants into the fill metal layer 400*b*, for example, a bottom portion of the fill metal layer 400*b*.

The material options for the fill metal layers 400*a* and 400*b* depends on design needs and require balancing the various characteristics described above, such as the formation margin, the resistance, the work function, the stress effect, the fabricability, etc. The fill metal layers 400*a* and 400*b* may include the same or different materials between each other. Generally, if the formation margin is of the primary concern for a GAA device, the device may adopt the structure of GAA device 100B, where the fill metal layer 400*b* includes a fill metal material having the suitable work function and forms directly on the dielectric layer 380. Conversely, if the fill metal material having the suitable work function does not have the suitable stress effect or suitable resistances, the device may adopt the structure of GAA device 100A and use separate materials to achieve the optimal properties. For example, it may be desired to maximize the formation margins for the p-type device and also maximize the conductance in the fill metal layers of both n-type and p-type devices. In this scenario, both fill metal layers 400a and 400b may use a same low-resistance material, for example, Ru. The formation of the fill metal layers 400a and 400b may be at the same time (e.g. in a single processing step) or may be at different times (e.g. in separate processing steps). As described above, the Ru fill metal layer 400a is formed over a p-type work function metal layer 390, while the Ru fill metal layer 400b is formed over the dielectric layer 380. For another example, it may be desired to maximize the formation margin for the n-type device and maximize conductance in the fill metal layer of p-type device. In this scenario, the GAA device 100B may be configured as an n-type device with an Al fill metal layer without a separate n-type work function metal layer, while the GAA device 100A may be configured to be a p-type device with a Ru fill metal layer with an appropriate p-type work function metal layer. For yet another example, it may be desired to maximize the formation margin for the n-type device while the conductance for the p-type device may be not as critical. In this scenario, the GAA device 100B may be configured as an n-type device with an Al fill metal layer without a separate n-type work function metal layer; and the GAA device 100A may be configured as a p-type device with an Al fill metal layer with an appropriate p-type work function metal layer (e.g. TiN, Ru, etc). The Al fill metal layers for both devices may be formed at the same time in a single step to reduce fabrication costs. Therefore, the fill metal layers 400a and 400b may include the same or different materials, and may be formed at the same or different processing stages. In some embodiments, the metal gate structure 510b is free of conventional fill metal materials, such as Cu, Co, and W.

While the above descriptions focus primarily on GAA device 100A and GAA device 100B having different device structures, and that the deposition treatments 350 and 352 are different processes, the present disclosure also contemplates both GAA devices having the same structure (although with different materials). For example, as illustrated in FIG. 10, both GAA devices receive the same deposition treatment 352. GAA device 100A is an n-type device, and has a fill metal layer 400a that includes Al and disposed over and directly contacts the dielectric layer 380. Meanwhile, GAA device 100B is a p-type device, and has a fill metal layer 400b that includes Ru and disposed over and directly contacts the dielectric layer 380. Neither GAA device 100A or GAA device 100B includes a separate work function metal layer. This scheme further integrates the features of the GAA devices, and maximizes formation margins in both p-type and n-type regions. Accordingly, fabricability may be substantially improved. However, this present disclosure also contemplates embodiments that include separate work function metal layers in both n-type and p-type GAA devices to achieve some of the advantages described here.

As described above, the fill metal layer 400 (including 400a and 400b), the work function metal layer 390 (in the n-type region), the dielectric layer 380, and the dielectric layer 370 may each wrap around each of the underlying surfaces in 360 degrees. However, the present disclosure is not so limited. Alternatively (not depicted), the dielectric layer 370 may circumferentially wrap around only a subset of the semiconductor layers 120 while leaving the remaining semiconductor layers 120 "naked." Similarly, the dielectric layer 380 may circumferentially wrap around its underlying surface (either that of the semiconductor layers 120 themselves, or that of the dielectric layer 370, if present) over only a subset of the semiconductor layers 120, while leaving the remaining surfaces "naked." Same applies to the work function metal layer 390 and the fill metal layer 400.

In many embodiments, the method continues to form additional contact features, as well as other components of an interconnection structure that couple the active regions through the contact features. In some embodiments, the same material, such as Ru, may also be used in these additional components to further integrate the conductive pathways and improve the device fabricability. For example, in addition to using Ru in the fill metal layer 400b, Ru may also be used in contacts, via features, and/or metal lines. Similar benefits may be achieved, such as larger feature volumes, lower resistances, enhanced carrier mobilities, and increased reliability and reduced cost.

FIG. 11 shows a cross-sectional view of an interconnection structure 602 over a semiconductor device. The interconnection structure 602 includes various conductive features configured to couple various devices into a functional circuit, such as a functional SRAM circuit, or a logic circuit including an SRAM circuit. In the depicted embodiment, the interconnection structure 602 is disposed over the semiconductor device, for example, GAA device 100A and/or GAA device 100B. The interconnection structure 602 includes contact features 410 (also referred to as MD contact) over the source/drain features 210 of the GAA device 100A and/or GAA device 100B. A layer of self-aligned silicide material (also referred to as a salicide layer) may be disposed between the source/drain features 210 and the contact feature 410. The interconnection structure 602 further includes a via feature 604 (also referred to as VD) over the contact feature 410, and a via feature 606 (also referred to as VG) over the metal gate 510. Via features 604 and 606 connect the contact features and the metal gates to metal lines (such as a VD rail 608) that further connect to a power source. The contact features 410, via features 604 and 606, and metal line 608 are embedded within various ILD layer, such as ILD layer 230 and ILD layers 232-234 to provide separation and isolation among various conductive features. The ILD layer 232 is disposed over the ILD layer 230 and separated by a contact-etch stop layer (CESL) 220; and the ILD layer 234 is disposed over the ILD layer 232 and separated by a contact-etch stop layer (CESL) 220. ILD layers 232-234 resemble the ILD layer 230 in many aspects. In some implementations, the interconnection structure 602 includes barrier layers 240. Note various device features and/or additional metal layers and ILD layers are not illustrated in FIG. 11 for clarity and simplicity.

As described above, in some embodiments, the contact features 410 and/or the via features 604 and 606 may include the same material as in the fill metal layer 400a/400b. For example, the fill metal layer 400a/400b may include Ru, and the contact features 410 and/or the via features 604 and 606 may also include Ru, such that Ru extends from an outer surface of a gate dielectric layer, through a fill metal layer, and a via feature, to a top surface of the via feature. Additionally, Ru may also extend from a top surface of the source/drain feature, through a contact feature, and a via feature, to a top surface of the via feature. As described above, by using the same materials, the various conductive layers may be integrated, and the fabrications are substantially simplified. As a result, efficiency, reliability and cost associated with the fabrications are improved. In some embodiments, the contact features 410 may have a thickness of about 0.5 nm to about 90 nm. In some embodiments, the interconnection structure 602 further includes a layer of low resistance interface barrier metal around the contact feature 410. The interface barrier metal layer may include any suitable metals, such as W, Mo, Ir, Pt, Os. Alternatively, the interface barrier metal layer may include TiN or TaN. The interface barrier metal layer may have a thickness of about 0.5 nm to about 5 nm. However, in some other embodiments, the barrier metal is absent. The via features 604 and 606 may be formed using similar methods. In some implementations, the via features may be formed without a barrier layer. The via features may have a thickness of about 0.5 nm to about 60 nm. Metal lines may be formed, depending on the purpose and the design of the devices.

Figure 12A:
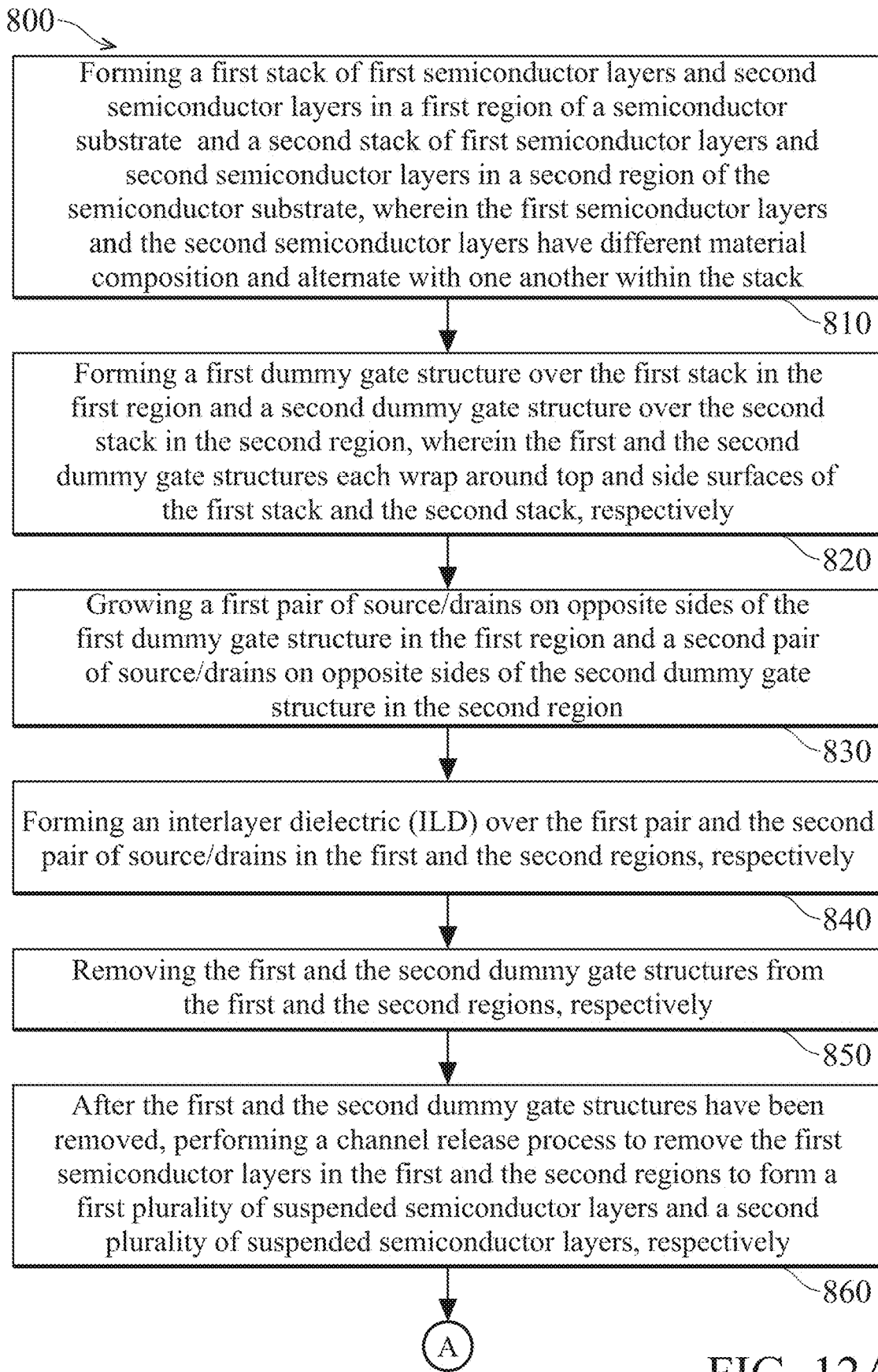
FIGS. 12A and 12B are a flowchart illustrating a method of fabricating a semiconductor structure according to various aspects of the present disclosure.
Figure 12B:
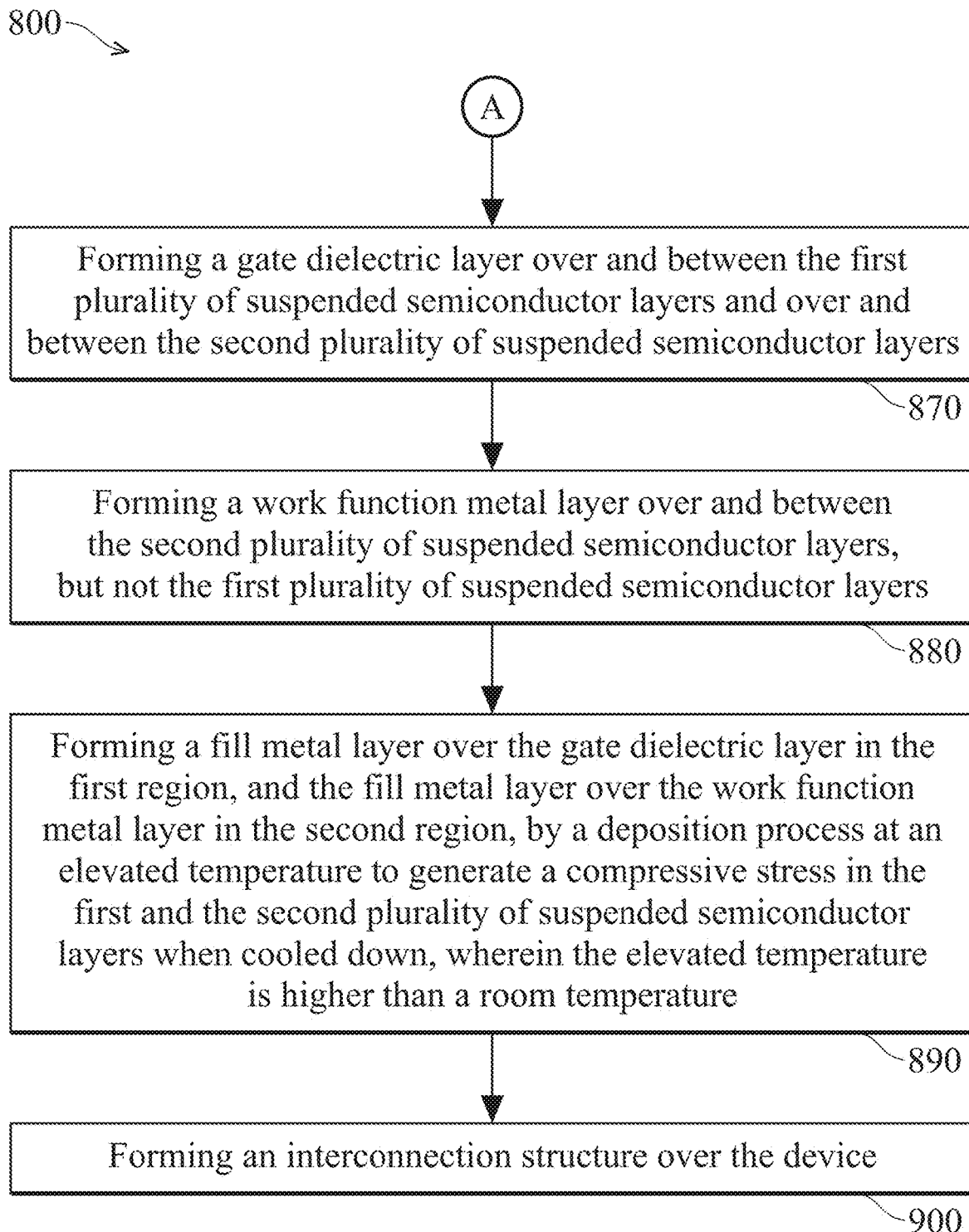

FIGS. 12A and 12B illustrate a flowchart of a method 800 of manufacturing a semiconductor structure, for example an Integrated Circuit (IC) device. The method 800 includes a step 810 of forming a first stack of first semiconductor layers and second semiconductor layers in a first region of a semiconductor substrate and a second stack of first semiconductor layers and second semiconductor layers in a second region of the semiconductor substrate. The first semiconductor layers and the second semiconductor layers have different material composition and alternate with one another within the stack. The method 800 may further include a step 820 of forming a first dummy gate structure over the first stack in the first region and a second dummy gate structure over the second stack in the second region, wherein the first and the second dummy gate structures each wrap around top and side surfaces of the first stack and the second stack, respectively; a step 830 of growing a first pair of source/drains on opposite sides of the first dummy gate structure in the first region and a second pair of source/drains on opposite sides of the second dummy gate structure in the second region; a step 840 of forming an interlayer dielectric (ILD) over the first pair and the second pair of source/drains in the first and the second regions, respectively; a step 850 of removing the first and the second dummy gate structures from the first and the second regions, respectively; a step 860 of performing a channel release process to remove the first semiconductor layers in the first and the second regions to form a first plurality of suspended semiconductor layers and a second plurality of suspended semiconductor layers, respectively; a step 870 of forming a gate dielectric layer over and between the first plurality of suspended semiconductor layers and over and between the second plurality of suspended semiconductor layers; a step 880 of forming a work function metal layer over and between the second plurality of suspended semiconductor layers, but not the first plurality of suspended semiconductor layers; a step 890 of forming a fill metal layer over the gate dielectric layer in the first region, and the fill metal layer over the work function metal layer in the second region. The method 800 may further include a step 900 of forming an interconnection structure over the devices. In some embodiments, the IC device fabricated includes GAA devices.

The fill metal layers may be formed in a fluorine-free process. For example, the fill metal layers may be formed from halogen-free precursors. Processes using halogen-based precursors (such as tungsten hexafluorides, tungsten hexachlorides) often leave behind halides (such as fluorides and/or chlorides) in the fill metal layers in relatively minute quantities. However, these chemicals, even in small amounts, have been shown to diffuse into one or more underlying layers (such as work function metal layers, dielectric layers), fins (including channel layers), and/or other layers and/or structures of the devices, and to adversely affect device performances. For example, diffusion of fluorine contaminants into underlying work function metal layers can negatively affect the work function and consequently, negatively affect the threshold voltage. Furthermore, non-uniform diffusion of contaminants may cause non-uniformity in the threshold voltages of the devices, which degrades device reliability. Although barrier layers have been used to alleviate the some of these problems, they are not always effective. For example, fluorine is known to penetrate common barriers such as TiN and TaN. Additionally, as described above, the use of barrier layers reduces formation margins of necessary layers, and present challenges in other areas of the fabrications. By contrast, some of the precursors used here include no halides (such as fluorine or chlorine), but rather are carbonyl-based or MOCVD-based precursors. Accordingly, halides are never introduced into the system in these embodiments, such that the concern are effectively eliminated. For example, the fill metal layer 400a and/or 400b may include Ru. The fill metal layer 400a and/or 400b may be formed from triruthenium dodecacarbonyl ($Ru_3(CO)_{12}$), tricarbonyl[(1,2,4,5-.eta.)-1-methyl-1,4-cyclohexadiene]ruthenium ($C_{10}H_{10}O_3Ru$), ($\eta^6$-benzene)(($\eta^6$-benzene)($\eta^4$-1,3-cyclohexadiene)ruthenium ($Ru(C_6H_6)(C_6H_8)$), ruthenium(III) acetylacetonate 1,3-cyclohexadiene ($Ru(C_5H_7O_2)_3$); (tricarbonyl) ruthenium(0) ($Ru(CO)_3(C_6H_8)$), bis(ethylcyclopentadienyl) ruthenium(II) ($Ru(C_5H_4C_2H_5)_2$), ruthenium pentacarbonyl ($Ru(CO)_5$), 2,3-dimethylbuta-1,3-diene tricarbonyl ruthenium (Ru (DMBD)($CO_3$)), bis(cyclopentadienyl)ruthenium ($RuCp_2$), bis(ethylcyclopentadienyl)ruthenium ($Ru(EtCp)_2$), tris(2,2, 6,6-tetramethyl-3,5-heptanedionato)ruthenium ($Ru(thd)_3$), any other suitable precursors, or combinations thereof.

The fill metal layers may be formed by a deposition process at a relatively low, but elevated temperature (higher than a room temperature) to generate a compressive stress in the nanochannels when cooled down. The use of a low temperature reduces the variation of threshold voltage, thereby increases the fabrication reliability. For example, the Ru fill metal layers 400a and/or 400b may be formed by CVD at a deposition temperature between about 100° C. and about 200° C. In one embodiment, triruthenium dodecacarbonyl ($Ru_3(CO)_{12}$) is used as a precursor for forming Ru as the fill metal layer 400a and/or 400b. If the deposition temperature is too low (for example, below 100° C.), the precursor for the fill metal may not be in a physical state suitable for deposition. For example, $Ru_3(CO)_{12}$ is a solidus material at room temperature, and only vaporizes above 80° C. If the deposition temperature is below 100° C., the vapor pressure may not be sufficient to conduct an efficient deposition. On the other hand, if the deposition temperature is too high (for example, above 200)° ° C., the precursor may experience degradation such that the deposited materials include undesirable impurities (such as reaction products between Ru-based clusters and the substrate). However, the temperature of Ru deposition may vary from about 100° C. to about 400° C. depending on the material choice for the Ru precursor. As described above, the depositing temperature may be tuned in order to adjust the compressive stress asserted by the fill metal. Alternatively, the fill metal layer 400a and/or 400b may be formed by ALD at similar conditions.

In one embodiment, a CVD or ALD deposition process includes multiple deposition cycles, each forming a Ru layer. For example, each deposition cycle may introduce the Ru precursor into the reaction chamber using a carrier gas, such as nitrogen ($N_2$), argon (Ar), and/or carbon monoxide (CO) at a flow rate of about 20 sccm to about 500 sccm. The reaction chamber may be maintained a pressure of about 3 mTorr to about 100 mTorr. The reaction chamber may also be maintained at an elevated temperature of about 100° C. to about 200° C., such as between about 125° C. to about 195° C. The reaction duration of the cycle (or "pulse") may be about 0.5 see to about 3 sec. In one embodiment, the reaction is followed with a purge step to remove products that are physiosorbed on the substrate. For example, a purge gas of $N_2$, Ar, and/or CO may be passed through the reaction chamber for a specified time duration. During the purge process, the chamber may be maintained at the elevated temperature about 100° C. to about 200° C., such as between about 125° C. to about 195° C.; and at a pressure of about 0.5 Torr to 10 Torr. Multiple layers of Ru films (which may be doped with oxygen) may be formed using this process. In some embodiments, 1-10 layers may be formed. These reaction conditions (such as temperature, pressure, flow rate) are designed to effectuate the advantages described above (such as producing stresses of the suitable type and magnitude).

In one embodiment, the purge process within a deposition cycle is followed with an oxidation treatment so as to dope the Ru film with oxygen (O) dopants. For example, oxidizing agents (such as with RPS radicals, stand-alone molecular oxygen and/or other suitable oxidizing agents) may be introduced to react with the Ru film. Alternatively or additionally, the purge process may be followed with an ammonia ($NH_3$), phosphine ($PH_3$), and/or diborane ($B_2H_6$) treatment so as to dope the Ru film with nitrogen (N), phosphorous (P), and/or boron (B), respectively. Exemplary precursor gases including these dopants may be phosphine ($PH_3$), ammonia ($NH_3$), and diborane ($B_2H_6$). Furthermore, cis-dihydridotetrakis(trimethylphosphine)ruthenium (cis-$H_2Ru(PMe_3)_4$) may also be used to form Ru films doped with P. This treatment processes may be followed with another purge process before a subsequent deposition cycle begins. In some embodiments, all deposition cycles include a doping treatment process. In some other embodiments, only first few deposition cycles include the doping treatment process, while later deposition cycles do not. Accordingly, the dopants may be distributed in only a bottom portion of the fill metal layers 400a and/or 400b.

In one embodiment, a post-deposition annealing process is conducted on the fill metal layer 400a and/or 400b in order to reach the suitable compressive stress over the nanochannels. For example, the fill metal layers 400a and/or 400b may be subjected to an annealing treatment at a temperature of about 400° ° C. to 500° C., with an annealing ambient that includes hydrogen gas ($H_2$) at a percentage of about 1% to about 10%. For another example, the fill metal layers 400a and/or 400b may be subjected to an annealing treatment at a temperature of about 400° C. to 500° ° C., with an annealing ambient that includes only nitrogen gas ($N_2$). These reaction conditions (such as temperature, annealing ambient, percentages) are designed to effectuate the advantages described above (such as producing stresses of the suitable type and magnitude).

In another embodiment, the fill metal layers 400a and/or 400b includes Al. For example, a CVD Al deposition process followed by reflow Al process may be used to form the Al fill metal layers. The Al fill metal layer may be doped with nitrogen (N), carbon (C), and/or titanium (Ti) to achieve work functions that differ from that of pure Al.

It is understood that additional processes may be performed before, during, or after the steps 810-900. For example, the method 800 may include steps of forming contact openings, self-aligned silicide layers, contact metals, as well as various contacts, vias, lines to connect the various features to form a functional circuit that may include one or more multi-gate devices. When self-aligned silicide layers are formed, they may include Ti, Co, Ni, NiCo, Pt, Ni(Pt), Ir, Pt(Ir), Er, Yb, Pd, Rh, Nb, TiSiN, or combinations thereof.

The interconnection structure may include contact features, via features and metal line features. These features may be deposited by any suitable methods, such as CVD, PVD, electroless deposition (ELD), electrochemical plating (ECP) or ALD. The contact features, via features and metal line features may be formed using a metal-organic or inorganic precursors, such as those containing Ru, Ir, Ni, Os, Rh, Al, Mo, W, Co, or combinations thereof, along with a reactant gas, such as hydrogen ($H_2$), oxygen ($O_2$), or ammonia ($NH_3$), at a flow rate of about 10 sccm to about 500 sccm and a pressure of about 0.0001 torr to about 10 torr. In some embodiment, the formation of portions of the interconnection structure, such as a contact feature, may be integrated with the formation of the fill metal layer 400a and/or 400b. For example, an ALD process is used to form a bottom portion of the fill metal layer 400a and/or 400b. Subsequently, a CVD process is used to form a top portion of the fill metal layer, as well as the contact features 410 and/or the via features 604 and/or 606.

Based on the above discussions, it can be seen that the embodiments of the present disclosure offer advantages over conventional semiconductor devices. It is understood, however, that no particular advantage is required, other embodiments may offer different advantages, and that not all advantages are necessarily disclosed herein. One advantage is the reduction of resistance. As discussed above, in conventional GAA devices, typical fill metal materials include Co, Cu, and W. Due to the narrow dimensions of features and the intrinsic material property, these fill metal materials do not provide a sufficiently low resistance to offer the desired performance or even functionality. Here, new fill metal materials, such as Ru, is used instead. It provides lower resistivity at the relevant dimensions. Furthermore, barrier layers are no longer needed. Accordingly, limited spacing between features are freed up in favor of larger and better fill metal, effectively further reducing the resistance of the device. In addition, some of these novel fill metal materials, such as Ru and Al, also assert appropriate type and amount of stress on the channel layers thereby further increasing the mobility of carriers in the channel region. These metals also have better reflow properties, thus is beneficial to formation of various features, particularly of re-entrant features. Furthermore, the use of these novel fill metal materials also enabled fluorine-free processes. As such, the present disclosure can improve the performance, reliability, and/or economics of GAA devices.

One general aspect of the present disclosure involves an integrated circuit (IC) device. The IC device includes a semiconductor substrate, a first plurality of semiconductor layers having a semiconductor material over the semiconductor substrate, a first gate dielectric layer circumferentially wrapping a first layer of the first plurality of semiconductor layers, and a first gate electrode. The first gate electrode includes a work function metal layer having a first conductive material circumferentially wrapping the first gate dielectric layer, and a first fill metal layer having a second conductive material wrapping the work function metal layer.

The integrated circuit also includes a second plurality of semiconductor layers having the semiconductor material over the semiconductor substrate, a second gate dielectric layer circumferentially wrapping a second layer of the second plurality of semiconductor layers, and a second gate electrode. The second gate electrode includes a second fill metal layer having the second conductive material wrapping and directly contacting the second gate dielectric layer. A top surface of the second fill metal layer extends above a topmost layer of the second plurality of semiconductor layers. The first conductive material has a work function lower than a midgap of the semiconductor material, and the second conductive material has a work function higher than the midgap of the semiconductor material.

In some embodiments, the first plurality of semiconductor layers contact an n-type doped source feature and an n-type doped drain feature; the second plurality of semiconductor layers contact a p-type doped source feature and a p-type doped drain feature; and the second conductive material has a work function equal to or higher than about 4.7 cv. In some embodiments, the second conductive material has a coefficient of thermal expansion (CTE) larger than that of the semiconductor material, and a channel region of the second layer includes a compressive stress of at least about 70 mpa to about 80 mpa asserted by the second conductive material. In some embodiments, the work function metal layer includes one of titanium (Ti), aluminum (Al), tantalum (Ta), titanium aluminum (TiAl), titanium aluminum nitride (TiAlN), tantalum carbide (TaC), tantalum carbide nitride (TaCN), tantalum silicon nitride (TaSiN). In some embodiments, the semiconductor material includes silicon; the first and the second gate dielectric layers each include a high-k dielectric material; and the second conductive material includes ruthenium (Ru), iridium (Ir), osmium (Os), rhodium (Rh), or combinations thereof. In some embodiments, the second conductive material includes Ru.

In some embodiments, the second plurality of semiconductor layers each extends in a first direction, and each has a first lateral dimension measured in a second direction that is perpendicular to the first direction. Each of the second plurality of semiconductor layers is disposed over one another in a third direction that is orthogonal to a plane defined by the first direction and the second direction. A first portion of the second gate dielectric layer interposes between adjacent layers of the second plurality of semiconductor layers in the third direction. The second fill metal layer directly contacts a second portion of the second gate dielectric layer and extends horizontally and continuously from a first sidewall of the second portion to a second sidewall of the second portion. In some embodiments, The IC device further includes an interconnection structure, where the interconnection structure includes a gate contact feature of the second conductive material, and where the gate contact feature extends continuously to the second fill metal layer.

Another general aspect of the present disclosure involves an integrated circuit (IC) device. The IC device includes a semiconductor substrate having a first active region and a second active region, a first source feature and a first drain feature disposed on the first active region, and a second source feature and a second drain feature disposed on the second active region. The integrated circuit also includes a first plurality of semiconductor layers interposing the first source feature and the first drain feature, and a second plurality of semiconductor layers interposing the second source feature and the second drain feature. The integrated circuit also includes a first gate dielectric layer circumferentially wrapping each of the first plurality of semiconductor layers, and a second gate dielectric layer circumferentially wrapping each of the second plurality of semiconductor layers. The integrated circuit further includes a first gate electrode having a first conductive layer circumferentially wrapping and directly contacting the first gate dielectric layer, and a first gate contact feature over and directly contacting the first gate electrode. The integrated circuit further includes a second gate electrode that includes a work function metal layer circumferentially wrapping each of the second gate dielectric layer and a second conductive layer circumferentially wrapping and directly contacting the work function metal layer, and a second gate contact feature over and directly contacting the second gate electrode. The first plurality of semiconductor layers include a compressive stress asserted by the first conductive layer.

In some embodiments, the work function metal layer has a first sidewall and a second sidewall opposite the first sidewall; the second gate dielectric layer has a third sidewall and a fourth sidewall opposite the third sidewall; where an upper portion of the first conductive layer extends horizontally and continuously from the first sidewall to the second sidewall; and where an upper portion of the second conductive layer extends horizontally and continuously from the third sidewall to the fourth sidewall. In some embodiments, the first conductive layer includes a first metal material, where the first metal material has a work function equal to or higher than about 4.7 ev, and the second conductive layer includes the first metal material. In some embodiments, the first metal material has a coefficient of thermal expansion (CTE) larger than that of the semiconductor substrate, and the second conductive layer asserts a compressive stress of at least about 70 MPa to about 80 MPa over the second plurality of semiconductor layers. In some embodiments, the first metal material includes one of ruthenium (Ru), iridium (Ir), osmium (Os), rhodium (Rh).

Yet another general aspect of the present disclosure includes a method. The method includes forming a first plurality of suspended semiconductor layers in a first region of a semiconductor substrate, and a second plurality of suspended semiconductor layers in a second region of the semiconductor substrate, where each of the first and the second plurality of suspended semiconductor layers is spaced away from one another. A gate dielectric layer is formed to circumferentially wrap the first plurality of suspended semiconductor layers and the second plurality of suspended semiconductor layers. A work function metal layer is formed over a portion of the gate dielectric layer to circumferentially wrap the second plurality of suspended semiconductor layers. A fill metal layer is formed on and directly contacting the gate dielectric layer in the first region, and on and directly contacting the work function metal layer in the second region. In some embodiments, the fill metal layer is formed by a deposition process at an elevated temperature sufficient to generate a compressive stress in the first plurality of suspended semiconductor layers when cooled down. In some embodiments, the fill metal layer includes a first metal material selected from ruthenium (Ru), iridium (Ir), osmium (Os), and rhodium (Rh).

In some embodiments, the forming of the first and the second plurality of suspended semiconductor layers each includes: forming a semiconductor stack of first semiconductor layers and second semiconductor layers, where the first semiconductor layers and the second semiconductor layers have different material compositions and alternate with one another within the semiconductor stack; forming a dummy gate structure over the semiconductor stack, where the dummy gate structure wraps around top and side surfaces of the semiconductor stack; growing source/drains on opposite sides of the dummy gate structure; forming an interlayer dielectric (ILD) over the source/drains; removing the dummy gate structure; and after the dummy gate structure has been removed, performing a channel release process to remove the first semiconductor layers. In some embodiments, the forming of the fill metal layer includes forming the fill metal layer such that an upper portion of the fill metal layer continuously extends from a first sidewall of the gate dielectric layer to a second sidewall of the gate dielectric layer opposite the first sidewall. In some embodiments, the first metal material includes ruthenium (Ru). In some embodiments, the forming of the fill metal layer includes depositing the first metal material over the gate dielectric layer at an elevated temperature over 100° C. In some embodiments, the depositing of the first metal material includes tuning a temperature between about 100° C. and about 200° C. to adjust a compressive stress over a channel region such that the compressive stress is over about 70 MPa to about 80 MPa. In some embodiments, the method further including forming an interconnection structure over the first and the second plurality of suspended semiconductor layers, where the interconnection structure includes a first conductive feature having the first metal material, and where the first conductive feature continuously extends to the fill metal layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a first plurality of suspended semiconductor layers in a first region of a semiconductor substrate, and a second plurality of suspended semiconductor layers in a second region of the semiconductor substrate, wherein each of the first and the second plurality of suspended semiconductor layers is spaced away from one another;
   forming a gate dielectric layer to circumferentially wrap the first plurality of suspended semiconductor layers and the second plurality of suspended semiconductor layers;
   selectively forming a work function metal layer to circumferentially wrap the second plurality of suspended semiconductor layers but not the first plurality of suspended semiconductor layers; and
   forming a fill metal layer on and directly contacting the gate dielectric layer in the first region and on and directly contacting the work function metal layer in the second region, wherein the fill metal layer circumferentially wraps around the first and the second plurality of suspended semiconductor layers;
   forming a first gate contact feature over and directly contacting the fill metal layer in the first region;
   forming a second gate contact feature over and directly contacting the fill metal layer in the second region; and
   forming an interlayer dielectric layer on sidewalls of the first and the second gate contact features.

2. The method of claim 1, wherein the fill metal layer is formed from one or more halogen-free precursors.

3. The method of claim 1, wherein the forming of the fill metal layer includes applying a compressive stress by the fill metal layer on the first plurality of suspended semiconductor layers of at least about 70 MPa to about 80 MPa.

4. The method of claim 3, wherein the compressive stress is tuned by doping the fill metal layers with platinum (Pt), nitrogen (N), tungsten (W), molybdenum (Mo), or cobalt (Co).

5. The method of claim 1,
   wherein the fill metal layer includes a metal having a work function greater than about 4.6 eV to about 4.8 eV,
   wherein the forming of the fill metal layer includes performing a deposition process at an elevated temperature sufficient to generate a compressive stress asserted by the fill metal layer on the first plurality of suspended semiconductor layers when cooled down.

6. The method of claim 5,
   wherein the elevated temperature is between about 100° C. and about 200° C.,
   wherein the deposition process includes using triruthenium dodecacarbonyl (Ru3(CO)12) as a precursor.

7. The method of claim 5, wherein the fill metal layer includes ruthenium (Ru), and the work function metal layer includes aluminum (Al).

8. The method of claim 7, wherein the fill metal layer includes ruthenium (Ru) doped with oxygen.

9. The method of claim 1,
   wherein the fill metal layer includes a metal having a work function lower than about 4.1 eV to about 4.3 eV,
   wherein the forming of the fill metal layer includes performing a deposition process at an elevated temperature sufficient to generate a tensile stress asserted by the fill metal layer on the first plurality of suspended semiconductor layers when cooled down.

10. The method of claim 9, wherein the fill metal layer includes aluminum (Al), and the work function metal layer includes ruthenium (Ru).

11. The method of claim 10, wherein the fill metal layer includes aluminum (Al) doped with nitrogen (N), carbon (C), and/or titanium (Ti).

12. A method, comprising:
   forming a first plurality of suspended semiconductor layers in a first region of a semiconductor substrate, and a second plurality of suspended semiconductor layers in a second region of the semiconductor substrate, wherein each of the first and the second plurality of suspended semiconductor layers is spaced away from one another;
   forming a gate dielectric layer to circumferentially wrap the first plurality of suspended semiconductor layers and the second plurality of suspended semiconductor layers;
   forming a work function metal layer over a portion of the gate dielectric layer to circumferentially wrap the second plurality of suspended semiconductor layers; and
   forming a fill metal layer on and directly contacting the gate dielectric layer in the first region and the work function metal layer in the second region,
   wherein the forming of the fill metal layer includes performing a deposition process at an elevated temperature is sufficient to generate a tensile stress asserted by the fill metal layer on the first plurality of suspended semiconductor layers when cooled down, wherein the fill metal layer includes aluminum (Al).

13. The method of claim 12, wherein the forming of the fill metal layer includes implanting dopants into the fill metal layer, the dopants including yttrium (Y), silicon (Si), germanium (Ge), or combinations thereof.

14. The method of claim 12, wherein the work function metal layer is a p-type work function metal layer having titanium nitride (TiN).

15. The method of claim 12, further comprising forming an interconnection structure over the first and the second plurality of suspended semiconductor layers, wherein the interconnection structure includes a first conductive feature extending to land on the fill metal layer.

16. An integrated circuit (IC) device, comprising:
- a semiconductor substrate having a first transistor region and a second transistor region, the first transistor region includes first source/drain features doped with a first dopant, the second transistor region includes second source/drain features doped with a second dopant, the first and second dopants are opposite type dopants;
- a first plurality of stacked semiconductor layers in the first transistor region and a second plurality of stacked semiconductor layers in the second transistor region;
- a gate dielectric layer that wraps around each of the first and second plurality of stacked semiconductor layers;
- a first metal gate in the first transistor region, the first metal gate having a work function metal layer and a first fill metal layer, wherein the work function metal layer wraps around and is in direct contact with the gate dielectric layer and the first fill metal layer wraps around and is in direct contact with the work function metal layer;
- a second metal gate in the second transistor region, the second metal gate having a second fill metal layer that wraps around and is in direct contact with the gate dielectric layer;
- a first gate contact feature over and directly contacting the first fill metal layer of the first metal gate; and
- a second gate contact feature over and directly contacting the second fill metal layer of the second metal gate,
- wherein the first and the second fill metal layers are of a same conductive material.

17. The IC device of claim 16, wherein the first and the second fill metal layers include ruthenium, and the work function metal layer includes aluminum.

18. The IC device of claim 17, wherein the first and the second gate contact features also include ruthenium.

19. The IC device of claim 16, wherein the first and the second fill metal layers include aluminum, and the work function metal layer includes ruthenium.

20. The IC device of claim 17, wherein the first and the second gate contact features also include aluminum.

* * * * *